United States Patent
Alzahabi et al.

(10) Patent No.: US 10,480,289 B2
(45) Date of Patent: Nov. 19, 2019

(54) FRACTURABILITY INDEX MAPS FOR FRACTURE PLACEMENT AND DESIGN OF SHALE RESERVOIRS

(71) Applicant: Texas Tech University System, Lubbock, TX (US)

(72) Inventors: Ahmed Alzahabi, Lubbock, TX (US); Mohamed Y. Soliman, Lubbock, TX (US); Noah Everett Berlow, Amarillo, TX (US); Timothy Michael Spinner, Humble, TX (US)

(73) Assignee: Texas Tech University System, Lubbock, TX (US)

( * ) Notice: Subject to any disclaimer, the term of this patent is extended or adjusted under 35 U.S.C. 154(b) by 762 days.

(21) Appl. No.: 14/865,447

(22) Filed: Sep. 25, 2015

(65) Prior Publication Data

US 2016/0090823 A1    Mar. 31, 2016

Related U.S. Application Data

(60) Provisional application No. 62/055,769, filed on Sep. 26, 2014, provisional application No. 62/220,540, filed on Sep. 18, 2015.

(51) Int. Cl.
*E21B 41/00* (2006.01)
*E21B 43/26* (2006.01)
*E21B 43/30* (2006.01)

(52) U.S. Cl.
CPC .............. *E21B 41/00* (2013.01); *E21B 43/26* (2013.01); *E21B 43/30* (2013.01)

(58) Field of Classification Search
None
See application file for complete search history.

(56) References Cited

U.S. PATENT DOCUMENTS 6,714,870 B1 *   3/2004   Weston ................. E21B 47/022
                                                             702/6
7,647,969 B1      1/2010   Hill
(Continued)

FOREIGN PATENT DOCUMENTS

WO    2013187904 A1    12/2013

OTHER PUBLICATIONS

Alqahtani, G. et al., "A Comparison between Evolutionary Metaheuristics and Mathematical Optimization to Solve the Wells Placement Problem," Advances in Chemical Engineering and Science (2013) 3:30-36.
(Continued)

*Primary Examiner* — J. H. Hur
(74) *Attorney, Agent, or Firm* — Kermit D. Lopez; Luis M. Ortiz

(57) ABSTRACT

Methods and systems for generating a fracturability index for use in identifying fracture locations and propagation in subterranean formations. A well path can be divided into a plurality of segments and the order of fracture locations along the path can be identified. Such an order is based on an optimal fracture stage from a production point of view followed by subsequent fracture stages. The above steps or operations can be repeated with respect to additional paths to generate data for use in determining prioritized segments and identifying fracture locations and propagation in subterranean formations. Such data can be compiled in the context of a fracturability index map.

19 Claims, 13 Drawing Sheets

(56) References Cited

U.S. PATENT DOCUMENTS

| | | | |
|---|---|---|---|
| 8,200,465 | B2 | 6/2012 | Suarez-Rivera et al. |
| 8,729,903 | B2 | 5/2014 | Srnka et al. |
| 2002/0013687 | A1* | 1/2002 | Ortoleva ............ E21B 41/0064 703/10 |
| 2003/0060374 | A1 | 3/2003 | Cooke, Jr. |
| 2009/0038795 | A1 | 2/2009 | Kaminsky et al. |
| 2009/0254283 | A1 | 10/2009 | Jacobi et al. |
| 2011/0257944 | A1 | 10/2011 | Du et al. |
| 2011/0284214 | A1* | 11/2011 | Ayoub ................. E21B 43/26 166/177.5 |
| 2012/0137883 | A1 | 6/2012 | Bradley |
| 2013/0201795 | A1 | 8/2013 | Zhou et al. |
| 2013/0231910 | A1 | 9/2013 | Kumar et al. |
| 2013/0270011 | A1 | 10/2013 | Akkurt et al. |
| 2015/0145687 | A1* | 5/2015 | Roberts ............... E21B 47/122 340/853.2 |
| 2016/0003020 | A1* | 1/2016 | Sharma ................ E21B 43/26 166/250.1 |

OTHER PUBLICATIONS

Altindag, R., "Correlation of specific energy with rock brittleness concepts on rock cutting," The Journal of the South African Institute of Mining and Metallurgy Apr. 2003, pp. 163-172.

Alzahabi, A. et al., "Shale Gas Plays Screening Criteria: 'A Sweet Spot Evaluation Methodology'," Fracturing Impacts and Technologies Conference Sep. 2014, Lubbock, TX, 24 pages.

Alzahabi, A. et al., "Fracturability Index Maps for Fracture Placement in Shale Plays," Hydraulic Fracturing Journal (2015) 2(1):8-18.

Alzahabi, A. et al., "Fracturability Index is a Mineralogical Index: A New Approach for Fracturing Decision," SPE Saudi Arabia Section Annual Technical Symposium and Exhibition Apr. 21-23, 2015, Al-Khobar, Saudi Arabia, 32 pages.

Bello, R. O., "Rate Transient Analysis in Shale Gas Reservoirs with Transient Linear Behavior," Dissertation, May 2009, Doctor of Philosophy, Texas A&M University.

Bowker, K. A., "Barnett Shale gas production, Fort Worth Basin: Issues and discussion," AAPG Bulletin (2007) 91(4):523-533.

Britt, L. K. et al., "The Geomechanics of a Shale Play: What Makes a Shale Prospective!" The 2009 SPE Eastern Regional Meeting, Charleston, West Virginia, Sep. 23-25, 9 pages.

Buller, D. et al., "Petrophysical Evaluation for Enhancing Hydraulic Stimulation in Horizontal Shale Gas Wells," The SPE Annual Technical Conference and Exhibition (2010) Florence, Italy, Sep. 19-22, 21 pages.

Chopra, S. et al., "An Effective Way to Find Formation Brittleness," American Association of Petroleum Geologists (2012) online issue 48, 3 pages.

Cipolla, C. L. et al., "The Relationship Between Fracture Complexity, Reservoir Properties, and Fracture-Treatment Design," The SPE Annual Technical Conference and Exhibition (2010) Denver, Colorado, Sep. 21-24, pp. 438-452.

Close, D. et al., "Integrated workflows for shale gas and case study results for the Horn River Basin, British Columbia, Canada," The Leading Edge May 2012, pp. 556-569.

Daneshy, A., "Fracture Shadowing: Theory, Applications and Implications," The SPE Annual Technical Conference and Exhibition (2014) Amsterdam, The Netherlands, Oct. 27-29, 11 pages.

Fischer, M. K. et al., "Integrating Fracture Mapping Technologies to Optimize Stimulations in the Barnett Shale," The SPE Annual Technical Conference and Exhibition (2002) San Antonio, TX, Sep. 29-Oct. 2, 7 pages.

Hinz, D., "Increasing Production with Better Well Placement in Unconventional Shale Reservoirs," Halliburton—Formation and Reservoir Solutions (2012) 28 pages.

Jarvie, D. M. et al., "Unconventional shale-gas systems: The Mississippian Barnett Shale of north-central Texas as one model for thermogenic shale-gas assessment," AAPG Bulletin (2007) 91(4):475-499.

Jin, C. J. et al., "A Production Optimization Approach to Completion and Fracture Spacing Optimization for Unconventional Shale Oil Exploitation," The Unconventional Resources Technology Conference (2013) Denver, Colorado, Aug. 12-14, 12 pages.

Jin, X. et al., "Fracability Evaluation in Shale Reservoirs—An Integrated Petrophysics and Geomechanics Approach," The SPE Hydraulic Fracturing Technology Conference (2014) The Woodlands, TX, Feb. 4-6, 14 pages.

Kahraman, S. et al., "A brittleness index to estimate fracture toughness," International Journal of Rock Mechanics and Mining Sciences (2004) 41:343-348.

Kok, J. et al., "The Significance of Accurate Well Placement in the Shale Gas Plays," The SPE Tight Gas Completions Conference (2010) San Antonio, TX, Nov. 2-3, 7 pages.

Kowalska, S. et al., "Correlation of Mineralogical Indices of Brittleness with Acoustic Properties of Rocks in Basins of Different Diagenesis Level," The International Symposium of the Society of Core Analysis (2013) Napa Valley, CA, Sep. 16-19, 6 pages.

Manchanda, R. et al., "Time-Dependent Fracture-Interference Effects in Pad Wells," The SPE Unconventional Resources Conference (2013) The Woodlands, TX, Apr. 10-12, pp. 274-287.

Maxwell, S. et al., "Enhancing shale gas reservoir characterization using hydraulic fracture microseismic data," First Break (2012) 40:95-101.

Miller, C. et al., "Evaluation of Production Log Data from Horizontal Wells Drilled in Organic Shales," The SPE North American Unconventional Gas Conference and Exhibition (2011) The Woodlands, TX, Jun. 14-16, 23 pages.

Moon, B. et al., "Improving shale gas production through accurate well placement," World Oil (2011) February, 6 pages.

Mullen, M. et al., "Fracability Index—More Than Just Calculating Rock Properties," The SPE Annual Technical Conference and Exhibition (2012) San Antonio, TX, Oct. 8-10, 10 pages.

Ozkan, E., "Releasing Shale-Gas Potential with Fractured Horizontal Wells," Distinguished Lecturer Program, Society of Petroleum Engineers, Colorado School of Mines, Sep. 14, 2011, Phoenix Expo Trade & Event Center, 27 pages.

Parker, M. et al., "Haynesville Shale: Hydraulic Fracture Stimulation Approach," 2009 International Coalbed & Shale Gas Symposium, paper—0913, Tuscaloosa, Alabama, 12 pages.

Passey, Q. R. et al., "From Oil-Prone Source Rock to Gas-Producing Shale Reservoir—Geologic and Petrophysical Characterization of Unconventional Shale-Gas Reservoirs," The CPS/SPE International Oil & Gas Conference and Exhibition (2010) Beijing, China, Jun. 8-10, 29 pages.

Popa, A. S., "Optimizing the Selection of Lateral Re-Entry Wells through Data-Driven Analytics," The SPE Annual Technical Conference and Exhibition (2014) Amsterdam, The Netherlands, Oct. 27-29, 14 pages.

Rafiee, M. et al., "Hydraulic Fracturing Design and Optimization: A Modification to Zipper Frac," The SPE Annual Technical Conference and Exhibition (2012) San Antonio, TX, Oct. 8-10, 16 pages.

Rickman, R. et al., "A Practical Use of Shale Petrophysics for Stimulation Design Optimization: All Shale Plays are not Clones of the Barnett Shale," The 2008 SPE Annual Technical Conference and Exhibition (2008) Denver, CO, Sep. 21-24, 11 pages.

Sahai, V. et al., "Impact of Staggered Fracture Placement on Field Development of Unconventional Gas Reservoirs: a Critical Evaluation of Overlapping SRV's," The SPE Western Regional & AAPG Pacific Section Meeting, 2013 Joint Technical Conference, Monterey, CC, Apr. 19-25, 17 pages.

Stegent, N. et al., "Engineering Approach to Optimize Development Strategy in the Oil Segment of the Eagle Ford Shale: A Case Study," The SPE Annual Technical Conference and Exhibition (2012) San Antonio, TX, Oct. 8-10, pp. 226-234.

Vasantharajan, S. et al., "Well Site Selection Using Integer Programming Optimization," Proceedings of IAMG'97 (1997) pp. 421-426.

Wang, F. P. et al., "Screening Criteria for Shale-Gas Systems," Gulf Coast Association of Geological Societies Transactions (2009) 59:779-793.

(56) References Cited

OTHER PUBLICATIONS

Wang, J., "Studies of influencing factors for shale gas reservoir performance," Master Theses, Missouri University of Science and Technology, Spring 2014, 81 pages.

Warpinski, N., "Stimulating Shale Reservoirs—What have we Learned from Fracture Mapping," Halliburton (2009) 27 pages.

* cited by examiner

FRACTURABILITY INDEX MAPS FOR FRACTURE PLACEMENT AND DESIGN OF SHALE RESERVOIRS

CROSS-REFERENCE TO PROVISIONAL APPLICATION

This application claims priority under 35 U.S.C. 119(e) to U.S. Provisional Patent Application Ser. No. 62/055,769 entitled "Fracturability Index Maps for Selectively Enhancing Fracture Propagation in Subterranean Formations," which was filed on Sep. 26, 2014, the disclosure of which is incorporated herein by reference in its entirety. This application also claims priority under 35 U.S.C. 119(e) to U.S. Provisional Patent Application Ser. No. 62/220,540 entitled "Fracturability Index Maps for Fracture Placement and Design of Shale Reservoirs," which was filed on Sep. 18, 2015, the disclosure of which is also incorporated herein by reference in its entirety.

TECHNICAL FIELD

Embodiments are related to techniques for the recovery of petroleum and natural gas from subterranean reservoirs. Embodiments also relate to the determination of "sweet spots" in shale gas reservoirs and other subterranean formations. Embodiments additionally relate to a Fracturability Index (FI) and data maps for use in well placement and fracture optimization in unconventional reservoirs. Embodiments additionally relate to well placement and fracture design of shale reservoirs, FI maps for fracture placement in shale plays.

BACKGROUND

Hydraulic fracturing is a technology that contributes to improvements in oil and gas production. Hydraulic fracturing is used to create additional passageways in the oil, gas, and/or coalbed reservoir that can, by way of example, facilitate the flow of oil and/or gas to a producing well. Unconventional reservoirs such as shale gas reservoirs, coalbed methane reservoirs, and "tight gas" reservoirs, such as those whose gas-containing matrix have restricted porosity and permeability that impede the flow of oil or gas through the reservoir, are commonly fractured by injecting a fluid containing sand or other "proppant" and other ingredients under sufficient pressure to create fractures in the rock through which the desired product can more easily flow.

In hydraulic fracturing, the optimum spacing is a function of fluid flow and stress interference. The current trend in the industry is to place wells in a uniform manner and also place the fractures in an equally spaced distribution in the same time along the well path. The net pressure created as a result of introducing the first fracture will affect the initiation of the second and subsequent fractures, which sometimes leads to orientation of the fracture and a tortuositious path fracture. Therefore, some fracture stages are not successful in terms of accommodating proppant and in terms of production.

Additionally, it can be appreciated that shale possesses an ultra-low matrix permeability, which consequently requires the creation of hydraulic fracturing to maximize the contact area with the reservoir. The key to successful fracturing treatment in shale formation is the identification of the "sweet spots". Productive shale consists of higher and easier to fracture portions, but also may include, for example, quartz, feldspar or carbonate and clays, in addition to organic matter (Kerogen). Thus, mapping the best zones to fracture is a challenging process.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide a Fracturability index (FI) for use in identifying sweet spots in shale gas reservoirs and other subterranean formations.

It is another aspect of the of the disclosed embodiments to provide for methods and systems for generating FI maps for selectively enhancing fracture propagation in subterranean formations.

It is yet another aspect of the disclosed embodiments to provide for the use of FI maps in hydraulic fracture designs in unconventional wells.

It is still another aspect of the disclosed embodiments to provide for a method and system for determining the most productive segments in a 3D reservoir model.

It is another aspect of the disclosed embodiment to provide for fracturability index maps for fracture placement in shale plays.

It is yet another aspect of the disclosed embodiments to provide for an optimization approach for well placement and fracture design of shale reservoirs.

It is still another aspect of the disclosed embodiments to provide for a multi-grid fracture simulated reservoir mapping coupled with an optimization approach to shale reservoir well and fracture design, scheduling, and development.

The aforementioned aspects and other objectives and advantages can now be achieved as described herein. In an example embodiment, methods and systems can be implemented for generating a fracturability index for use in identifying fracture locations and propagation in subterranean formations. A well path can be divided into a plurality of segments, and the order of fracture locations along the path can be identified. Such an order is based on an optimal fracture stage from a production point of view followed by subsequent fracture stages. The above steps or operations can be repeated with respect to additional paths to generate data for use in determining prioritized segments and identifying fracture locations and propagation in subterranean formations. Such data can be compiled in the context of a fracturability index map.

In another example embodiment, a "realistic" FI index can be developed, which can be utilized to design horizontal wells paths. To help guide in well placement and fracture design optimization, two new correlations have been developed. A new fracturability index based on mechanical formation properties has been developed. This new fracturability index identifies the fracturing candidates more clearly than existing indices. This approach can optimize the net present value of a fracturing project in a shale play. Such a technique may require the design of the number of wells, fractures, productivity, etc.

In yet another example embodiment, a computational approach to FI optimization can be implemented based on mathematical optimization using Integer Programming (IP). A computational approach can be implemented to design wells and schedule hydraulic fractures to take advantage of the power afforded by recently developed FI applications.

In still another example embodiment, the creation of well-planned designs controlled by fracture placement in a 3D domain is a key goal. In such an embodiment, a Simulated Reservoir Volume (SRV), which is a key to optimum production in shale plays, can be modeled using a novel approach based on digitized grids, wherein each discrete cell in the grid takes into account geomechanical and geochemical properties of the reservoir in focus to accurately model the Stimulated Reservoir Volume resulting from placed fractures.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
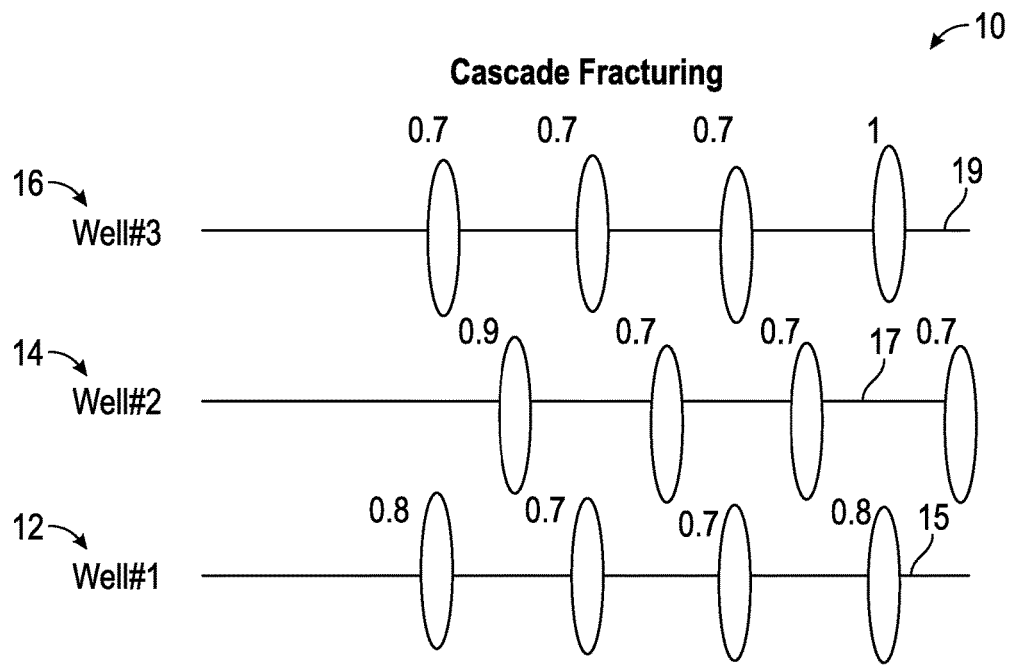
FIG. 1 illustrates a schematic diagram depicting data indicative of cascade fracturing, in accordance with an example embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to identical, like or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Fracturability Index (FI) approach disclosed herein can be employed to identify "sweet spots" in subterranean formations such as shale gas reservoirs. The use of an FI can lead to a better understanding of fracturability in shale gas reservoirs. As indicated previously, the current technology trend in the industry is to place wells in a uniform manner and also place the fractures in an equally spaced distribution in the same time along the path.

A new index ranging from [0:1] and based on geomechanics was developed to optimize the placement of fractures along horizontal and deviated wells in unconventional resources. Due to a reduction in stress contrast (e.g., as a result of creation of other fractures) and due to aiming the sweet spots, production maximization and effectiveness can be guaranteed in shale resources. An FI can be employed to prioritize the brittle and high in-situ stress zones along the well path, then suggest the order of possible fracture locations for future resource development in a single or many wells.

FIG. 1 illustrates a schematic diagram 10 depicting data indicative of cascade fracturing, in accordance with an example embodiment. In the sample diagram 10 illustrated in FIG. 1, three wells 12, 14, 16 (i.e., respectively, Well #1, Well #2, and Well #3) are depicted to the left of respective lines 15, 17, 19 which track data indicative of well spacing and fracturing spacing. The data depicted in diagram 10 thus indicates the optimization of such well spacing and fracture spacing.

The approach depicted in FIG. 1 is based on the fact that fractures may be placed in the same manner as conventional fracturing, but with different timing and pre-determined spacing along the wellbore, while selectively placing the fractures. In hydraulic fracturing, the optimum spacing is a function of fluid flow, stress interference, and the mechanical properties of the subterranean formations.

In conventional fracturing design, introducing the first fracture will affect the initiation of the second and subsequent fractures which sometimes will lead to orientation of the fracture and obtaining a tortuositious path fracture. This will affect the proppant acceptance capability and production efficiency per stage, sometimes failure in some stages. Introducing a new a design based on the developed index can solve this problem.

The disclosed FI approach works for designing static models and dynamic models while producing from reservoirs, modeling of the new technology showed a superior success when tested against simulation of actual field plans. Results from the new index applications indicates that shale gas model may be drained more effectively. In addition, the number of fracture stages designed using the disclosed index yields is lower than when designed using conventional techniques, thus reducing the cost of fracturing.

Identifying an index helps prioritize a fracture position and assists in scheduling of this position, which is a critical issue because doing so can prevent a number of operational troubles such as, for example, stress reversal. The use of such an index can help increase the overall production by 10% to 20% from unconventional gas shale, resulting in optimization of the well and field.

A general methodology can be implemented as follows:
1. Begin by dividing our well path into segments.
2. Identify the order of fracture locations along the well path, order the best fracture from production point of view, then the second fracture stage and so on.
3. Repeat the same approach for a second well, and the same for a third well, until simulation runs help decide the prioritized segments.

Such an approach can be utilized in re-fracturing or "re-frack" and is driven by a new definition of "re-frack". Some factors that have driven this new definition include fracturing positioning, the need for an effective quick tool for re-frack, problems associated with stress interference effects, along with the need to maintain the production plateau from declining. There is also a need to increase the number of effective fracturing positions, which the disclosed FI approach effectively addresses. Finally, the disclosed FI approach increases the change of hitting a natural fracture and of obtaining a more branched fracture rather than tortuositious path fracture, as indicated by the following equation (1):

$$FI = \sum_k \begin{pmatrix} 0 & \text{if the segement not brittle} \\ 1 & \text{if the segement brittle} \end{pmatrix} \quad (1)$$

Mathematical optimization using Integer programming (IP) proved its superior performance in vertical well placement (for details on its performance, see (AlQahtani et al. 2013). The idea behind using it is that IP guarantees optimality in any proven solution, unlike the use of Evolutionary Metaheuristics (GA) which may provide an optimal solution, but is sometimes trapped in local optimum. An integrated approach includes geomechanics, geochemistry, petrophysics, and rock and fluid properties, which together constitute a superior tool in the identification of shale gas reservoirs.

Figure 2:
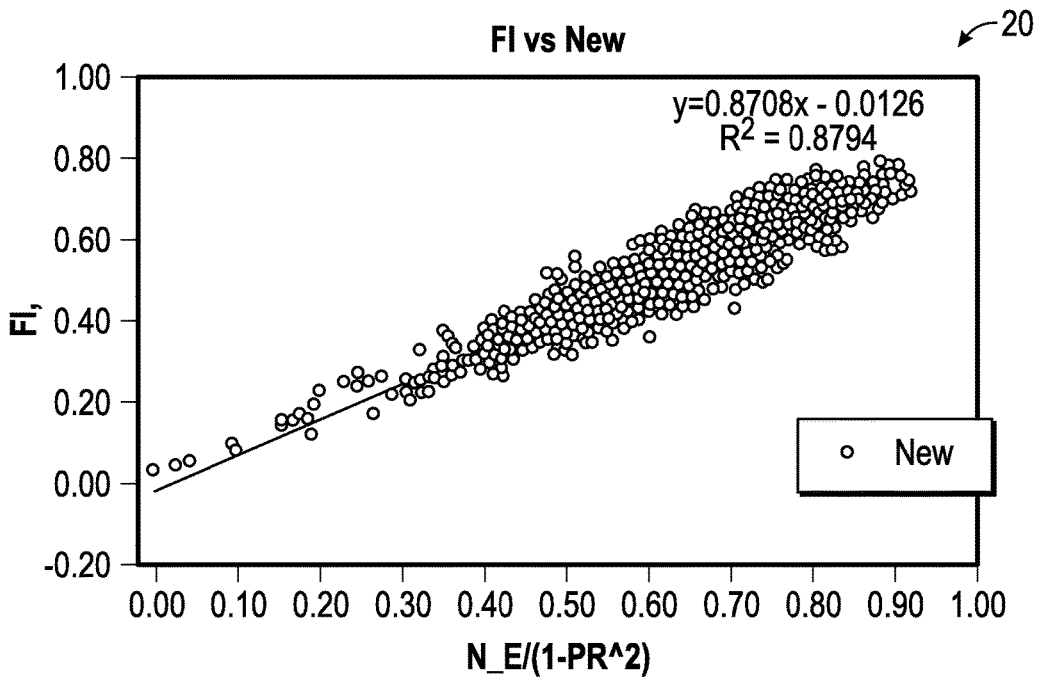
FIG. 2 illustrates an example fracturability index map, which can be generated in accordance with the methodology described herein.

FIG. 2 illustrates an example FI map 20, which can be generated in accordance with the methodology described herein. A representative map can include, but is not limited to, geochemical data (e.g., quartz and clays (illite, smectite, Kaolinite, Chlorite, Kerogen, Pyrite k-feldspar, . . . )) populated in a 3D reservoir model, which can provide a quick overview concerning the most brittle places in a 3D model. A second map can be configured based on geomechanical data. A third map may include total organic carbon (TOC) data. Populating the TOC can be accomplished using software such as, for example, PETREL. Other maps such as permeability, porosity, and maturation (Ro) can be employed to assist in the definition of sweet spots in shale gas reservoirs.

Figure 3:
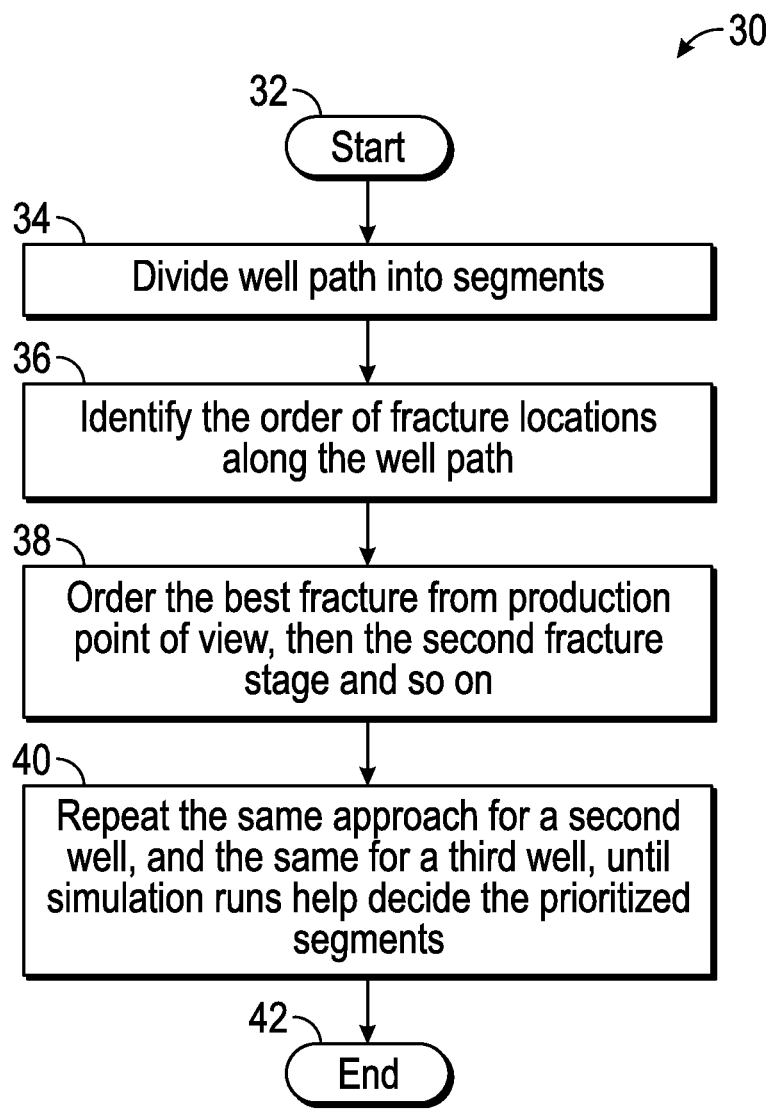
FIG. 3 illustrates a flow-chart of operations depicting logical steps or operations of a method of generating a fracturability index map, in accordance with another example embodiment.

FIG. 3 illustrates a flow-chart of operations depicting logical steps or operations of a method 30 of generating a fracturability index map, in accordance with an example embodiment. As indicated at block 32, the process can be initiated. Then, as shown at block 34, a step or logical operation can be implemented in which the well path is divided into segments. Thereafter, as indicated at block 36, a step or logical operation can be implemented for identifying the order of fracture locations along the well path. Such ordering can include, as indicated at block 38, the best fracture from production point of view, then a second fracture stage, and so on. Then, as depicted at block 40, an operation of the same approach for a second well can be repeated, as well as for a third well, and so forth, until simulation runs assist in determining the prioritized segments. The process can then terminate, as shown at block 42.

The FI approach of, for example, method 30 can be employed to identify "sweet spots" in shale gas reservoirs. The disclosed FI can be employed in the design of static models and dynamic models of reservoir production. Modeling of this approach has shown a superior success when tested against actual field plans. This new index will pioneer resources development and exploitation process in North America.

With this disclosed approach, fractures can be placed in the same manner as conventional fracturing, but with different timing and spacing along the wellbore, while selectively placing the fractures. In hydraulic fracturing, the optimum spacing is a function of fluid flow and stress interference. The idea of placing fractures at different spacing has a geomechanical background, which justifies the disclosed embodiments. The current trend in the industry is to place wells in a uniform manner and also place the fractures in an equally spaced distribution in the same time along the path.

The net pressure created as a result of introducing the first fracture will affect the initiation of the second and subsequent fractures which sometimes leads to the orientation of the fracture and a tortuositious path fracture. Therefore, some fracture stages are not successful in terms of accommodating proppant and in terms of production. Hence, Young's modulus and Poisson's ratio are used in the industry for differentiating brittle from ductile rock. The new index discussed herein is based on both values and can function as a guide in fracturing shale gas resources.

The disclosed embodiments can be applied to introduce a lower number and more effective fracture at pre-designed distance from the previous fracture where minimum (optimum) stress exists so that the net pressure can overcome the stress anisotropy, thereby creating a longer and not tortuous fracture. Moving from the toe to the heel of the deviated wellbore, for example, greater spacing is required as the new fractures are introduced into the formation driven by the value of FI (see FIG. 1), and an option from alternating from well to the other or staying at the same well can be suggested by the software and the new technology.

The spacing design is based on the mechanical properties of the subterranean formations and can be an input by the user. The ultimate objective of the disclosed embodiments is to enhance production from unconventional reservoirs by optimizing the well placement and fracture placement in hydraulic fracturing designs at a lower cost.

The disclosed methodology can be immediately applied in current hydraulic fracture designs in unconventional wells for shale gas to create longer fractures in subterranean formations. The longer fractures enhance the productivity of the hydraulically fractured well by hitting natural fractures and reaching complexity in shale gas.

Approaches for determining the most productive segments in a 3D reservoir model are constantly being researched. Fracturability and brittleness can help to understand where the "sweet spots" are along with identifying the hot points for initiating fracturing. Early detection of good points to fracture and good points to recover more gas from shale resources is a challenge for many operators.

The creation of short transverse and/or axial fractures is a problematic phenomenon during hydraulic fracturing. These types of fractures decrease the productivity of a fractured well. The disclosed approach thus creates long fractures to enhance productivity of a fractured well through an integrated sequencing approach.

As can be appreciated by one skilled in the art, embodiments can be implemented in the context of a method, data processing system, and/or computer program product. Accordingly, embodiments may take the form of an entire hardware embodiment, an entire software embodiment, or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object oriented programming language (e.g., Java, C++, etc.). The computer program code, however, for carrying out operations of particular embodiments may also be written in conventional procedural programming languages, such as the "C" programming language or in a visually oriented programming environment, such as, for example, Visual Basic.

The program code may execute entirely on the user's computer, partly on the user's computer, as a stand-alone software package, partly on the user's computer and partly on a remote computer, or entirely on the remote computer. In the latter scenario, the remote computer may be connected to a user's computer through a local area network (LAN) or a wide area network (WAN), wireless data network e.g., WiFi, Wimax, 802.xx, and cellular network, or the connection may be made to an external computer via most third party supported networks (e.g., through the Internet via an Internet Service Provider).

The embodiments are described at least in part herein with reference to flowchart illustrations and/or block diagrams of methods, systems, and computer program products and data structures according to embodiments of the invention. It will be understood that each block of the illustrations, and combinations of blocks, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

Figure 4:
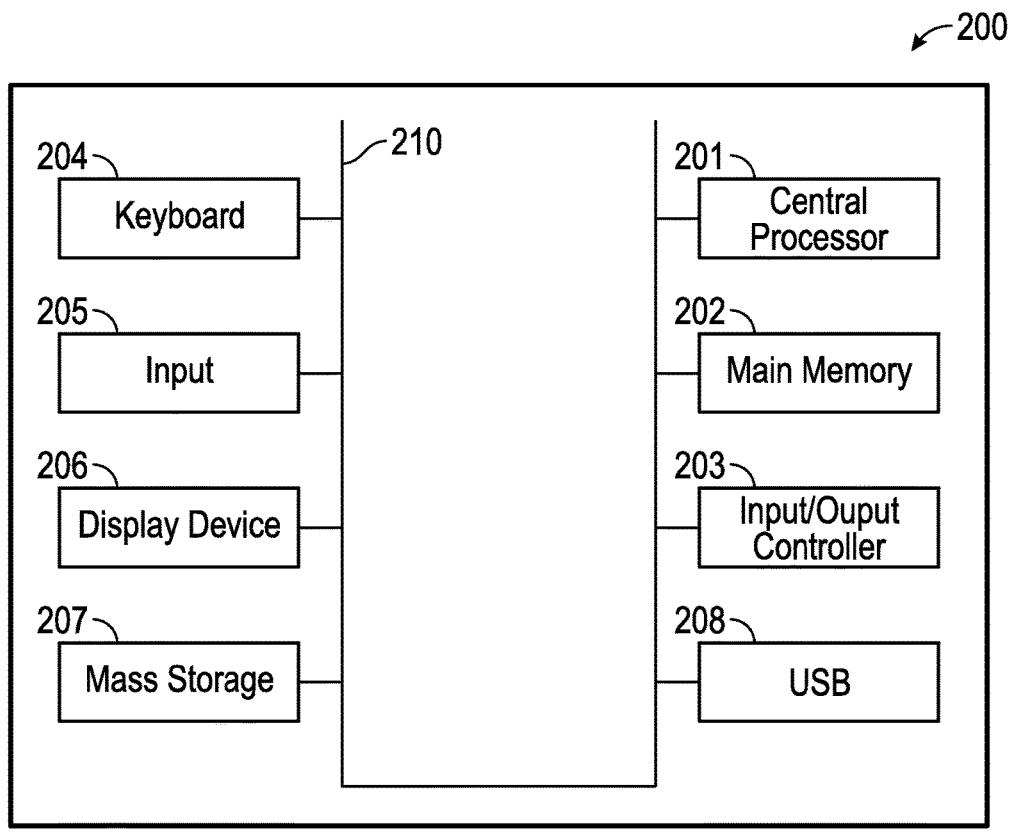
FIG. 4 illustrates a schematic view of a computer system, which can be implemented in accordance with an example embodiment.
Figure 5:
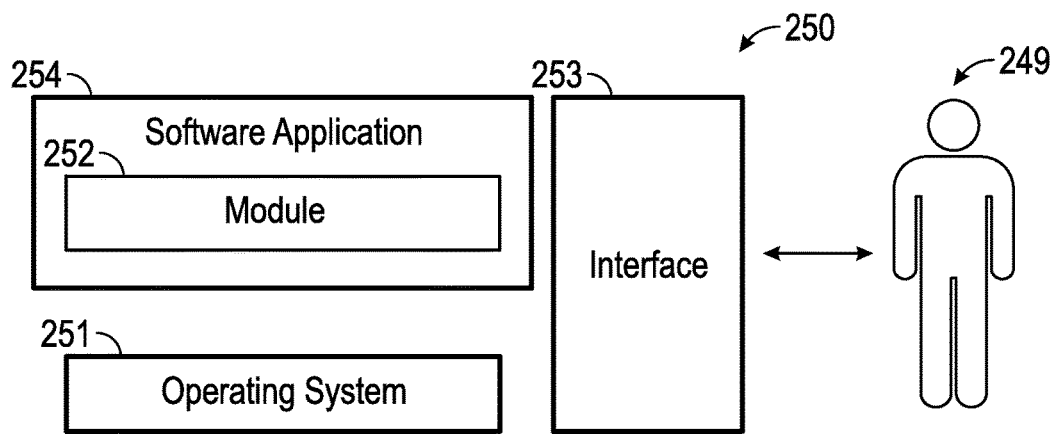
FIG. 5 illustrates a schematic view of a software system including a module, an operating system, and a user interface, which can be implemented in accordance with an example embodiment.

FIGS. 4-5 are provided as exemplary diagrams of data-processing environments in which embodiments may be implemented. It should be appreciated that FIGS. 4-5 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 4, some embodiments may be implemented in the context of a data-processing system 200 that includes, for example, a central processor 201, a main memory 202, an input/output controller 203, a keyboard 204, an input device 205 (e.g., pointing device, such as a mouse, track ball, pen device and/or a touchscreen, etc.), a display device 206, a mass storage 207 (e.g., a hard disk), and a USB (Universal Serial Bus) peripheral connection 208. As illustrated, the various components of data-processing system 200 can communicate electronically through a system bus 210 or similar architecture. The system bus 210 may be, for example, a subsystem that transfers data between, for example, computer components within data-processing system 200 or to and from other data-processing devices, components, computers, etc. Note that in some embodiments, a sensor 316 (shown in FIG. 6) may be employed which identifies the well path. Such a sensor 316 may communicate electronically with, for example, the processor 201, main memory 202, USB 208, etc.

FIG. 5 illustrates a computer software system 250 for directing the operation of the data-processing system 200 depicted in FIG. 4. Software application 254, stored in main memory 202 and on mass storage 207, generally includes a kernel or operating system 251 and a shell or interface 253. One or more application programs, such as software application 254, may be "loaded" (i.e., transferred from mass storage 207 into the main memory 202) for execution by the data-processing system 200. The data-processing system 200 receives user commands and data through user interface 253; these inputs may then be acted upon by the data-processing system 200 in accordance with instructions from operating system 251 and/or software application 254.

The following discussion is intended to provide a brief, general description of suitable computing environments in which the system and method may be implemented. Although not required, the disclosed embodiments will be described in the general context of computer-executable instructions, such as program modules, being executed by a single computer. In most instances, a "module" constitutes a software application.

Generally, program modules include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular abstract data type. Modules may be composed of two parts: an interface, which lists the constants, data types, variable, and routines that can be accessed by other modules or routines; and an implementation, which is typically private (accessible only to that module) and which includes source code that actually implements the routines in the module. The term module may also simply refer to an application, such as a computer program designed to assist in the performance of a specific task, such as word processing, accounting, inventory management, etc.

The interface 253, which is preferably a graphical user interface (GUI), also serves to display results, whereupon the user may supply additional inputs or terminate the session. In some embodiments, interface 253 may serve as, for example, interface discussed earlier herein. In an embodiment, operating system 251 and interface 253 can be implemented in the context of a "Windows" system. It can be appreciated, of course, that other types of systems are possible. For example, rather than a traditional "Windows" system, other operation systems such as, for example, Linux may also be employed with respect to operating system 251 and interface 253.

The software application 254 can include a module 252 that can, for example, function or actually be the data marketing and consolidation module 116 of system 100. Software application 254, on the other hand, can include instructions, such as the various operations described herein with respect to the various components and modules described herein, such as, for example, the instructions or steps of method 30 depicted in FIG. 3 with respect to blocks 32, 34, 36, 38, 40 and 42, and the instructions or steps of method 480 shown in FIG. 12, such as depicted in blocks 482, 484, 486, 488, 489, 490, 492, 494. Other examples of instructions which can be embodied by and/or implemented by software application 254 and module 252 include, for example, the steps or instructions of method 500 illustrated in FIG. 13 with respect to blocks 502, 504, 506, 508 and so on, and the instructions of methods 560 and 600 respectively shown in FIGS. 18-19.

FIGS. 4-5 are thus intended as examples and not as architectural limitations of disclosed embodiments. Additionally, such embodiments are not limited to any particular application or computing or data-processing environment. Instead, those skilled in the art will appreciate that the disclosed approach may be advantageously applied to a variety of systems and application software. Moreover, the disclosed embodiments can be embodied on a variety of different computing platforms, including Macintosh, UNIX, LINUX, and the like.

Figure 6:
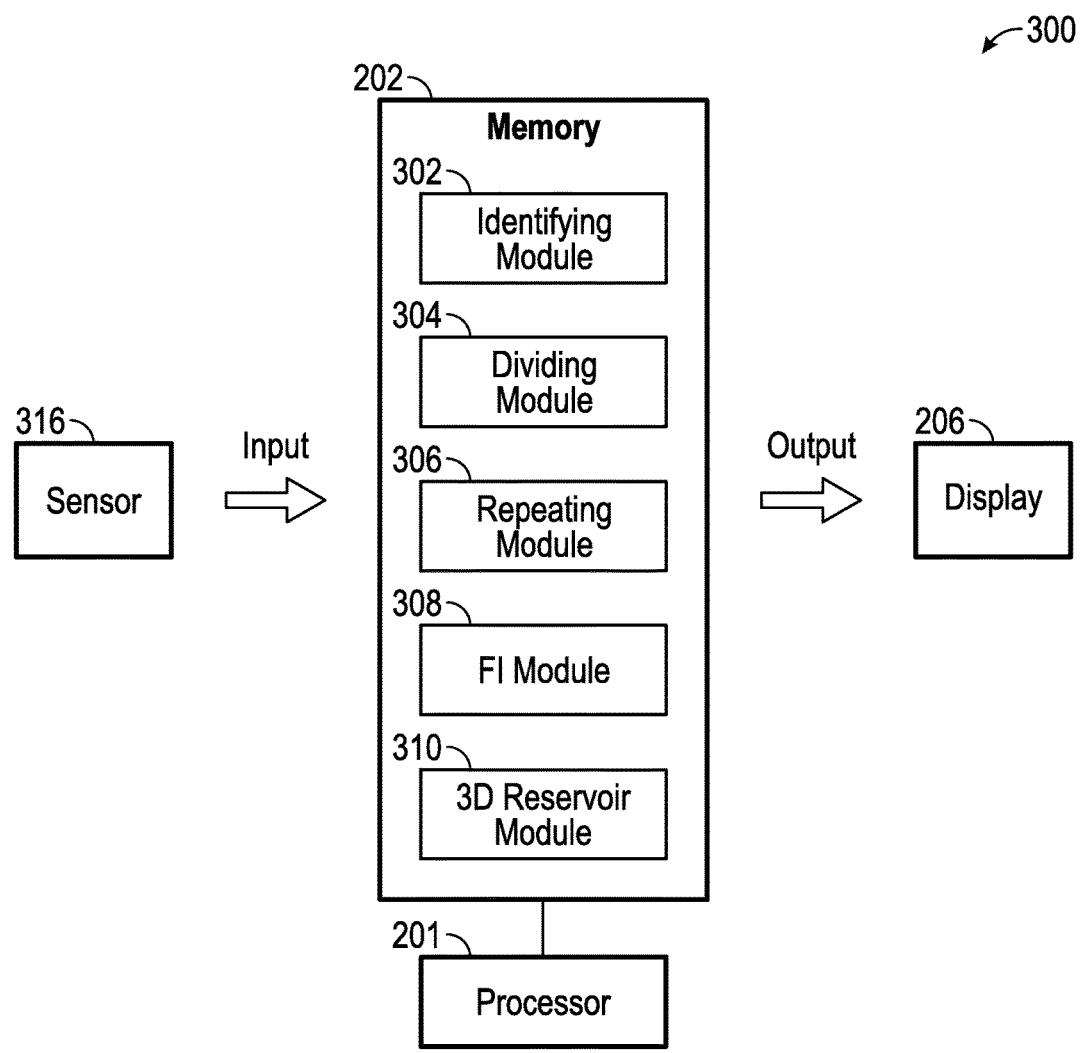
FIG. 6 illustrates a system for generating a fracturability index (FI) for use in identifying fracture locations and propagation in subterranean formations, in accordance with an example embodiment.

FIG. 6 illustrates a system 300 for generating a fracturability index (FI) for use in identifying fracture locations and propagation in subterranean formations, in accordance with an example embodiment. The system 300 depicted in FIG. 6 can include, for example, one or more processors such as processor 201, which communicates electronically with memory 202. Note that the memory 202 and processor 201 are similar or analogous to the same memory 202 and processor 201 shown in FIG. 4. Likewise, the modules 302, 304, 306, 308 and 310 shown in FIG. 6 are analogous to the module 252 shown in FIG. 5. That is, the module 252 depicted in FIG. 5 can be in some embodiments implemented as a module composed of a group of modules such as modules 302, 304, 306, 308, 310 or variations thereof.

Memory 202 includes instructions embodied in the context of modules 302, 304, 306, 308, 310, which when executed by the processor(s) 201, cause the processor(s) 201 to perform operations. For example, dividing module 304 can divide a path into a plurality of segments. The identifying module 302 can identify the order of fracture locations along the path, wherein the order is based on an optimal fracture stage from a production point of view followed by subsequent fracture stages. The repeating module 306 repeats the dividing and identifying operations with respect to additional paths so as to generate data for use in determining prioritized segments and identifying fracture locations and propagation in a subterranean formation. The FI module 308 can compile the aforementioned data into a fracturability index map. The 3D reservoir module 310 can compile such data as geochemical data populated in a 3D reservoir model. Data can be provided via sensor 316 as input and then output to the display 206 for viewing as a graphically displayed 3D reservoir model, FI map, and so on.

Figure 7:
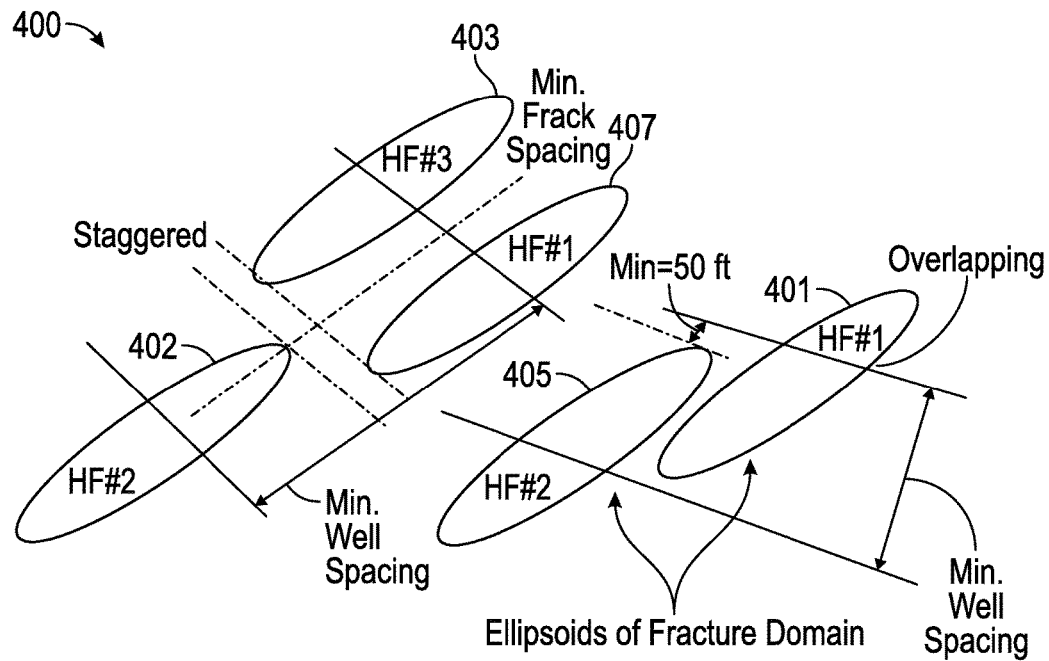
FIG. 7 illustrates an example of a fracturability index map with HF (Hydraulic Fracturing) and well spacings indicated, which can be implemented in accordance with an example embodiment.

FIG. 7 illustrates an example of a fracturability index map 400 with HF (Hydraulic Fracturing) and well spacings indicated, which can be implemented in accordance with an example embodiment. The example FI map 400 shown in FIG. 7 indicates hydraulic fractures 401, 402, 403, 405, 407 and placement and well spacing including minimum well spacing, minimum fracture ("frack") spacing, and also overlapping and staggered locations. The hydraulic fractures 401, 402, 403, 405, 407 are represented in FIG. 7 as ellipsoids of the fracture domain.

It can be appreciated that shale has an ultra-low matrix permeability and consequently requires the creation of hydraulic fracturing to maximize the contact area with the reservoir. A key to successful to fracturing treatment in shale formation is the identification of the sweet spots.

Productive shale is composed of higher and easier to fracture portions, but also consists of, for example, quartz, feldspar or carbonate and clays, in addition to organic matter (e.g., Kerogen). Thus, it is a challenging process to map the best zones to fracture. Mapping using an index to guide through well placement and fracture optimizations is the best option. The disclosed approach involves automating wells in the most productive segments in a 3D reservoir model. A high young modulus and low poission ratios values are key parameters for a promising shale; however, there is no general agreement about the exact limits of each. Few authors have made an acceptable definition of this index, until now.

FI (Fracturability index) as discussed herein can thus be utilized to identify "sweet spots" and can lead to a better understanding of fracturability in shale gas reservoirs. The current technology trend in the industry is to place wells in a uniform manner and also place the fractures in an equally spaced distribution in the same time along the path. A new index ranging from [0:1], for example, and based on geomechanics canthus optimize the placement of fractures. The FI map 400 is one example of an application of this approach.

An FI such as the example FI map 400 shown in FIG. 7 can assist in prioritizing a fracture position and in scheduling of the fracture. In some embodiments, mathematical optimization using Integer programming (IP) can be implemented in, for example, vertical well placement. The idea behind this approach is an assurance of optimality in any proven solution, unlike Evolutionary Metaheuristics (GA), which can provide an optimal solution, but sometimes is trapped in a local optimum. An integrated approach can include, for example, geomechanics, geochemistry, petrophysics, and rock and fluid properties, which can result in a superior tool in identifying shale gas reservoirs.

Figure 8:
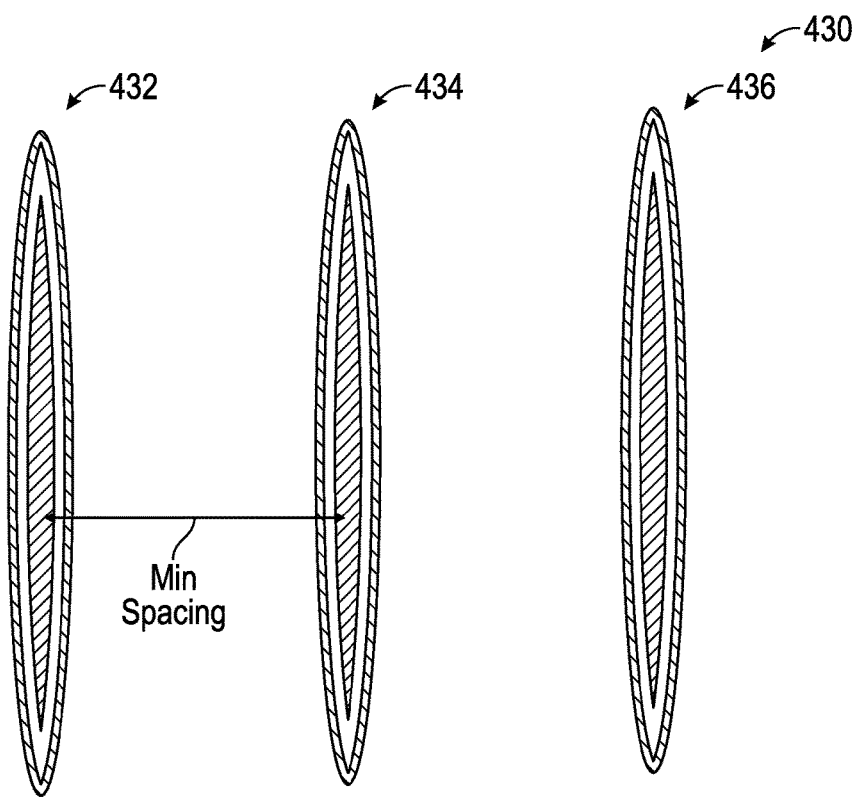
FIG. 8 illustrates a schematic diagram of fracturability index map indicating spacing, in accordance with an example embodiment.
Figure 9:
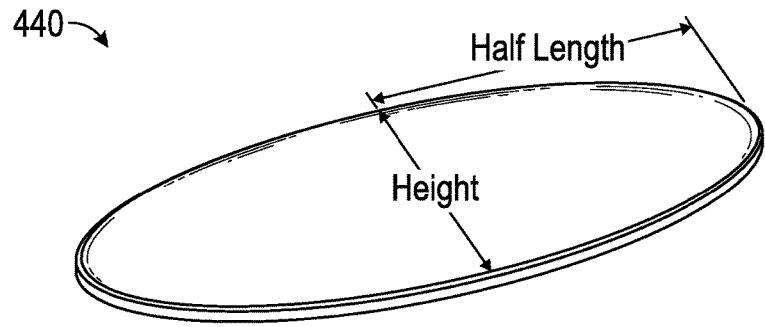
FIG. 9 illustrates a schematic diagram of a sample well with height and half-length shown, in accordance with an example embodiment.

FIG. 8 illustrates a schematic diagram of a fracturability index map 430 indicating spacing with respect to HF's 432, 434, and 436, in accordance with an example embodiment. FIG. 9 illustrates a schematic diagram of a sample well 440 with height and half-length shown, in accordance with an example embodiment.

A representative map can include (but is not limited to) geochemical data (e.g., quartz and clays (illite, smectite, Kaolinite, Chlorite, Kerogen, Pyrite k-feldspar, etc.)) populated in a 3D reservoir model, which can provides a fast idea regarding the most brittle places in the 3D model. A second map based on geomechanical data map based on geomechanics can be implemented, in addition to a third map that is total organic carbon (TOC), followed by populating TOC using software such as, for example, PETREL. Other maps such as permeability, porosity, and maturation (Ro) can also be used as a definition for sweet spots in shale gas reservoirs.

In an embodiment, design vector components can be, for example:
1—The number of transverse fractures
2—The Length of horizontal well
3—The Half Length of Fracture
4—Spacing (wells, fractures)
5—Cost
6—Pay zone thickness
7—Reservoir boundary dimensions (Ye, Xe)

Objectives of implementing an FI map can include, but are not limited to, creating a path dependent approach, planning for an optimum well path and optimum fracture design, automating this process, and also designing an optimum well spacing and fracturing scheme. Possible constraints may include the hydraulic fracture planned to propagate effectively above and below the optimum well path.

Figure 10:
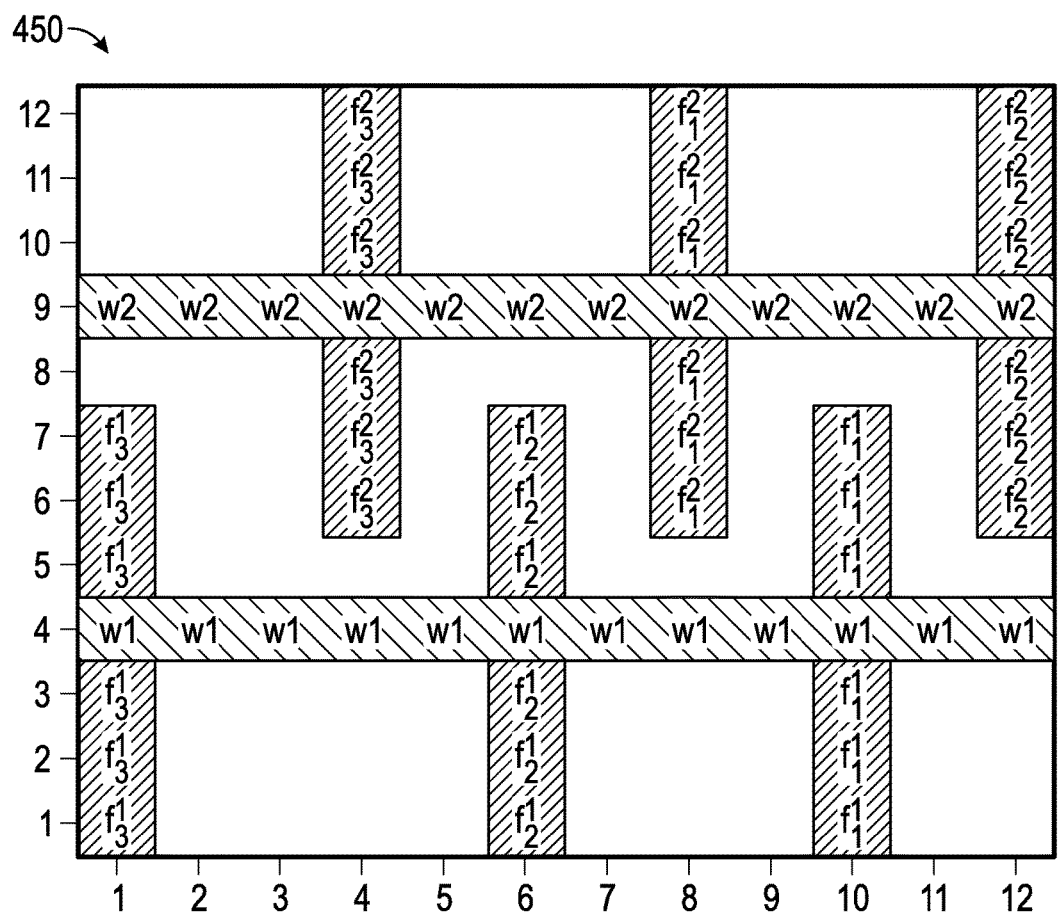
FIG. 10 illustrates a grid arrangement representative of testing parameters, in accordance with an example embodiment.

In a fracture design (fracturing path dependent), the following may apply:
Fracture length(Xf)<Xe & Fracture length(Xf)<Re*0.9
Pnet<1000 psi Here, design vector components can include the following:
1—No. of transverse fractures
2—Length of horizontal well
3—Half Length of Fracture
4—Spacing
5—Cost Note that in some embodiments, the well borehole may be path dependent. Constraints such as the following may be considered in these instances:
Completion spacing constraints, minimum and maximum between deviated wells >Xf+50
Azimuth around +−30 (well is in direction of minimum stress)
Inclination <=90, Inclination is usually around 90.
Azimuth is within 30 degrees of a pre-determined angle (direction of the minimum stress) allowed 60 degrees.
Maximum total length of lateral constraints <=Reservoir target centerline length Xe.
Reservoir Thickness (Top and Bottom) Keeping well close to the center line and hitting high FI values
Fracture length(Xf)<Re*0.9
Width is 0.001<w<0.04 m
Fracture has two parts like top half up and bottom half down from center of well
Decision variables may be as follows:

$w_{i,j,k}^{p} \in \{0, 1\} \quad \bar{w}_{i,j,k}^{p} \in \{0, 1\}$ $f_{i,j,k}^{p,m} \in \{0, 1\} \quad \bar{f}_{i,j,k}^{p,m} \in \{0, 1\}$ $w_{i,j,k}^{p}$ means well p extends through cell i,j,k (1=yes, 0=no)
$\bar{w}_{i,j,k}^{p}$ is complimentary to $w_{i,j,k}^{p}$, (the slide with equations will show why we use this)
$\bar{w}_{i,j,k}^{p} + w_{i,j,k}^{p} = 1$
with meaning: does well p not pass through cell i,j,k (1=yes, 0=no)
$f_{i,j,k}^{p,m}$ means does the $m^{th}$ fracture that branches off from well p extend through cell i,j,k (1=yes, 0=no)
$\bar{f}_{i,j,k}^{p,m}$ is complimentary to $f_{i,j,k}^{p,m}$, $f_{i,j,k}^{p,m} + \bar{f}_{i,j,k}^{p,m} = 1$
Examples of the following types of constraints are as follows:
1—Connectivity between cells containing well p
Either well p passes through cell (i,j,k) and a neighboring cell, i.e. one of i−1,j−1,k−1,i−1,j−1,k . . . i+1,j+1,k+1, or else well p does not pass through cell (i,j,k): wi,j,kp+wi−1,j−1,k−1p+ . . . wall other neighbors p≥1
2. No instant 90° turns:
wi,j+1,kp+wi,j,kp+wi+1,j,kp≤2
wi+,j+1, kp+wi,j,kp+wi+1,j−1,kp≤2
3. Spacing between wells p and q:
If di,j,k,(x,y,z)=i−x2+j−y2+k−z2<dminw,w, then wi,j,kp+wx,yzq≤1 Other constraints we can write in a similar format as 1-3:

4. Connectivity of the cells containing fracture (p,m)
5. Connectivity of well p with all its fractures (p,m), (p,n), etc.
6. Spacing between fracture (p,m) and fractures (p,n) of the same well p and fractures (q,m) from different wells q
7. Spacing between well p and fractures (q,m) from well q In some embodiments, an algorithm (code) can be tested. FIG. 10, for example, illustrates a grid arrangement 450 representative of testing parameters, in accordance with an example embodiment. Decision variables are binary decision variables describing whether each wellbore or fracture extends through each computational cell. The constraints limit the geometry, maximum dimensions, and relative placement of each well and fracture.

An example implementation of the algorithm can be written in Matlab. In such an implementation, a 2-dimensional reservoir with equal dimensions can be divided into equally sized computational cells. 144 cells can be used as a 12×12 grid, which is then used to divide the reservoir. Each cell can be assigned a fracturability index (FI) between 0 and 1. The described algorithm can be allowed to place up to 2 wellbores with 3 fractures extending from each. An optimal solution was achieved in one implementation in 398 seconds. An interdigitated design was achieved as FIG. 10 demonstrates. The wells are labeled by 'w' and the corresponding well number. The fractures are labeled with subscripted well numbers and superscripted stage numbers.

Based on the foregoing, it can be appreciated that a number of embodiments, preferred and alternative, are disclosed herein. For example, in a preferred embodiment, a method of generating a fracturability index for use in identifying fracture locations and propagation in subterranean formations can be implemented. Such a method can include steps or logical operations for dividing a path into a plurality of segments, identifying an order of fracture locations along the path, the order based on an optimal fracture stage from a production point of view followed by subsequent fracture stages, and repeating the dividing and identifying steps with respect to additional paths so as to generate data for use in determining prioritized segments and identifying fracture locations and propagation in a subterranean formation. In a preferred embodiment, the aforementioned path comprises a well path. In some embodiments, the data can be compiled into a fracturability index map.

In some embodiments, the subterranean formation constitutes a shale gas reservoir. In yet other embodiments, the data can be compiled as geochemical data populated in a 3D reservoir model. In another embodiment, the data can be compiled into a geomechanical data map based on geomechanics. In yet another embodiment, a step or operation can be provided for identifying the path via a sensor.

In another embodiment, a system of generating a fracturability index for use in identifying fracture locations and propagation in subterranean formations can be implemented. Such a system can include, for example, one or more processors and a memory comprising instructions stored therein, which when executed by the one or more processors, cause the one or more processors to perform operations including, for example: dividing a path into a plurality of segments; identifying an order of fracture locations along the path, the order based on an optimal fracture stage from a production point of view followed by subsequent fracture stages; and repeating the dividing and identifying steps with respect to additional paths so as to generate data for use in determining prioritized segments and identifying fracture locations and propagation in a subterranean formation. In some embodiments, a sensor for identifying the path can be implemented, wherein the sensor communicates electronically with the one or more processors and/or the memory.

In yet another embodiment, a method for 3D well placement and interdigitated fracture design for shale gas reservoirs can be implemented. Such a method can include steps or operations, for example, for placing fractures in an overlapping or staggered design while selectively locating fractures to remain within a producing zone; and introducing a lower number and thus more effective fracture at a pre-designated distance a previous fracture wherein a minimum or optimum stress exists so that a net pressure overcomes a stress anisotropy ratio to create a longer and not tortuous fracture.

In hydraulic fracturing, the optimum spacing is a function of fluid flow and stress interference. The current trend in the industry is to place wells in a uniform manner and also place the fractures in an equally spaced distribution in the same time along the well path. Depending on the time span of fracturing operations, the net pressure created as a result of introducing a fracture will affect the initiation of subsequent fractures, which sometimes leads to re-orientation of the created fracture and a non-planar path fracture. Therefore, some fracture stages may not be as successful as planned.

The key to successful fracturing treatment in shale formations is the identification of the "sweet spots". Productive shale consists of higher brittleness and easier to fracture segments. It may also include more quartz, feldspar or carbonate, and organic matter than less productive shale. Thus, mapping the best zones to fracture is usually a challenging process. Multistage fracturing has become the preferred approach used to fracture shale reservoirs. However, it appears that in many cases some stages or clusters are not contributing to production. In some cases, more than 100 horizontal shale wells were analyzed in multiple basins and it was found that two thirds of total production is coming from only one third of the perforation clusters. It has also been reported that one third of all perforation clusters were not contributing to production.

Petrophysical and geomechanical properties are the key behind fracturing design. It has been recommended to use reservoir and completion quality in designing stages and clusters along horizontal wells. Reservoir quality is defined by petrophysical properties of organic shale which make it a variable for development like maturity, porosity, and organic content. Completion quality is defined by the geomechanical parameters which are required to effectively stimulate the shale like stresses, mineralogy, and orientation of natural fractures. Shale brittleness indicator (BI) can be used to identify a brittle and productive shale. Brittleness can be defined as a function of Young's modulus and Poisson's ratio. The success of any fracturing placement may be related to the geochemical analysis which can be answered through petrophysical and lab measurements. Such work was more related to overall productive shale assessment, while the focus here is on productive segments of horizontal wells.

New optimization criteria can speed up the development process in unconventional reservoirs while reducing uncertainty and cost. Due to the expected severe heterogeneity of shale, prior techniques will not work. A combined elevated factor vanadium (EFV) can be used as an indicator of total organic carbon and relative brittleness index (RBI) for selecting intervals where it would be easy to initiate fractures.

A Brittleness Index is one of the main important parameters for screening shale systems. It is a function of mineral composition and digenesis. There is no general agreement regarding the definition of brittleness. Brittleness has been defined based on tensile and compressive strength of the rock. Others have suggested that the Barnett shale must contain less than 50% clay to be successfully fractured. Brittleness has also been redefined brittleness as the sum of quartz and feldspar.

In any event, the most common brittleness indicators can be given in the following equations:

$$E_n = \frac{E-1}{E_b - 1} \times 100$$

$$v_n = \frac{v_n - 0.4}{v_b - 0.4} \times 100$$

$$BI = \frac{E_n + v_n}{2}$$

where:
BI is Brittleness index based on mechanical properties
E is Young's Modulus in millions psi
$V_n$ is Poisson's ratio
$E_b$ and ub are correlation based Young's modulus and Poisson's ratio of 8 million-psi and 0.4, respectively
BI based on mineralogy can be written as given in the equation below:

$$BI = \frac{Q}{Q + C + CL}$$

Brittleness may vary horizontally and vertically. The present inventors believe that there is 3-D distribution of brittleness under certain applicable ranges. Many prospective shale core samples with Young's modulus in excess of 3.5 Å~106 psi, for example, have been found exhibit some shear anisotropy in the core plug level. Similarly, Poisson's ratio may also have anisotropic property distribution.

An example FI model may be based on the average product of normalized brittleness and strain energy release rate. Another FI model can be based on the average between normalized brittleness and normalized fracture toughness and the last model is the average of normalized brittleness and normalized Young's modulus. Their range of Fracturability Indices may vary between, for example, 0.4 and 0.84. A complex Fracturability Index may also be introduced. A primary rock property input in such an approach may be brittleness which is directly correlated with Brinell hardness.

Thus, additional objectives with respect to other embodiments can include the development of a realistic fracturability index, which may be used to design horizontal wells paths along with the design of an optimum well spacing and fracturing scheme, and the development of a fracture scheduling approach.

To achieve such objectives, the following limits can been set with respect to a developed module (e.g., a software module). For well placement, it can be assumed that a normal stress regime is the prevailing regime. Subsequently, a well can be drilled horizontally in direction of minimum stress to create transverse fractures to maximize the drainage area created by the transverse fractures and minimize the possibility of fracture tortuosity. An optimization module can be implemented to allow wells to be placed within, for example, 30 degrees of the direction of minimum horizontal stress. Fractures can be created simultaneously or within a fairly short time will be affected by stress shadowing.

Figure 11:
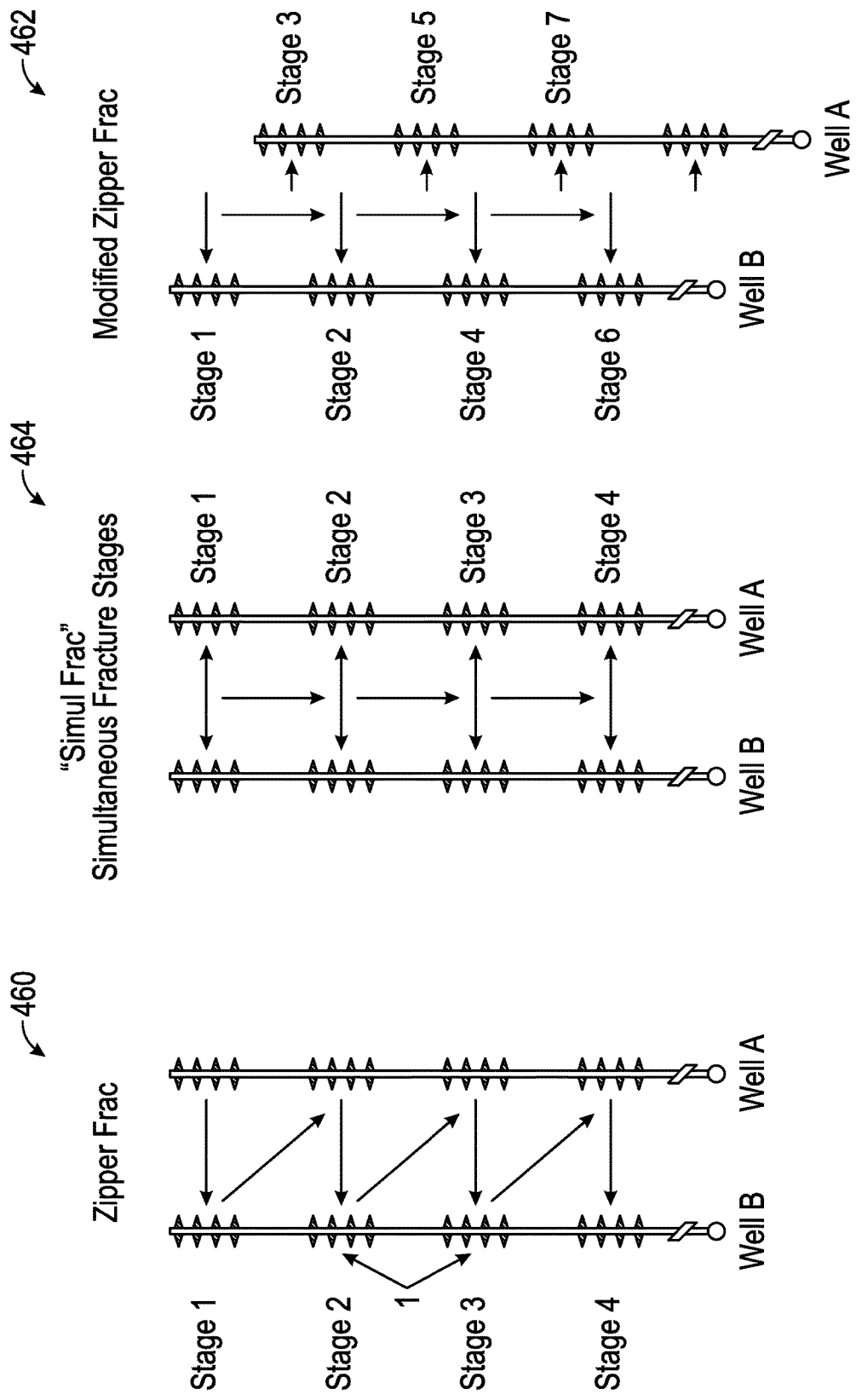
FIG. 11 illustrates a schematic diagram depicting different hydraulic fracture designs, in accordance with an example embodiment.

Various hydraulic fracture designs may be applied. Examples of these techniques are Zipper, modified Zipper, and Simultaneous hydraulic fracturing as shown in FIG. 11, which illustrates a schematic diagram depicting hydraulic fracture designs 460 (Zipper), 462 (modified Zipper), and 464 (simultaneous), in accordance with an example embodiment.

To assist in well placement and fracture design optimization, two new correlations are developed. The present inventors have found that considering a gamma ray log improves the correlation coefficient of the selected model. The data used for building such a model, for example, can be derived from the Permian Basin WolfCamp shale. The new correlation is given in the equation below while the range of use is given in Table 1.

$$FI = 0.871 \times E'_1 - (1/80)$$

where $$E'_n = \frac{\left[\left(\frac{E}{1-v^2}\right) - \left(\frac{E}{1-v^2}\right)_{min}\right]}{\left[\left(\frac{E}{1-v^2}\right)_{max} - \left(\frac{E}{1-v^2}\right)_{min}\right]}$$

$\left(\frac{E}{1-v^2}\right)_{min}$ = Minimum plane strain Young's Modulus in the reservoir $\left(\frac{E}{1-v^2}\right)_{max}$ = Maximum plane strain Young's Modulus in the reservoir FI accounts for the effect of mineralology and energy release for creating fractures.

TABLE 1

Data Range Used for Building FI Correlation

| Parameters | Min. value | Max. value |
| --- | --- | --- |
| E, psi | 0.38 E6 | 9.75 E6 |
| v, ratio | 0.02 | 0.38 |
| Calcite, wt. % | 0.00 | 83.0 |
| Quartz, wt. % | 6.00 | 75.0 |
| Pyrite, wt. % | 0.00 | 8.00 |
| Clay, wt. % | 3.00 | 49.0 |
| Density, ρ, g/cc. | 2.40 | 2.71 |

Another objective is to present an approach to optimize the net present value of a fracturing project in a shale play. This requires the design of the number of wells, fractures, productivity, etc. In the next section, the various parameters used in designing the optimization process are discussed. In some optimization situations, it can be assumed that the wells are horizontal or very close to horizontal.

In order to obtain a proper formulation, the following parameters can be determined utilizing an optimization technique: the number of fractures, fracture dimensions, fracture locations, and optimum scheduling.

A computational approach to FI calculation can be based on a mathematical optimization using IP (Integer Programming). An objective function as shown in the equation below indicates that the goal of the developed scheme is to maximize the sum of the fracturability indices at the points where fractures propagate:

$$\text{Maximize } \Sigma_{(i,j) \in I \times J} FI_{(i,j)} x_{(i,j)}$$

The maximization of the function in the equation above is subject to constraints in the following equations:

$$x_{i_1,j_1} + x_{i_2,j_1} \leq 1,$$

$$\left\{ \frac{(i_1, j_1), (i_2, j_2)}{\sqrt{(i_1-i_2)^2 + (j_1-j_2)^2}} < D, (i_1, j_1), (i_1, j_2) \in I \times J \right.$$

The equation above states that a minimum spacing between adjacent fractures can be specified.

$$\Sigma_{(i,j) \in I \times J} x_{i,j} \leq N$$

The above equation shows constraints in the total number of fractures per given shale plane.

$$x_{(i,j)}\{0,1\}$$

The above equation indicates that the location is a variable x(i,j) that represents the coordinates (i,j) in the shale formation plane, and is equal to 0 of the location is not chosen or 1 otherwise. Note that additional design constraints can include the net pressure less than a preset value based on the shale play and planned fracture design. Angular deviation constraints can include, for example, a well azimuth within 30 degrees of the direction of minimum stress, and a well inclination less than or equal to 90 degrees. An inclination is typically around 90 degrees.

Additionally, maximum length constraints can be considered. The fracture length, $X_j$, for example, may be less than the distance to the drainage boundary $X_e$. Additionally, the fracturability index is a continuous range [0 . . . 1]=f (E,v). The best well path achieves the condition established by the equation below.

$$\sum_{k=0}^{n} \binom{n}{k} \max averageFI(X, Y, Z)$$

The equation indicates that the well path will attain a maximum fracturability index. A new fracturability index can be used as an input matrix for well and future placement.

Figure 12:
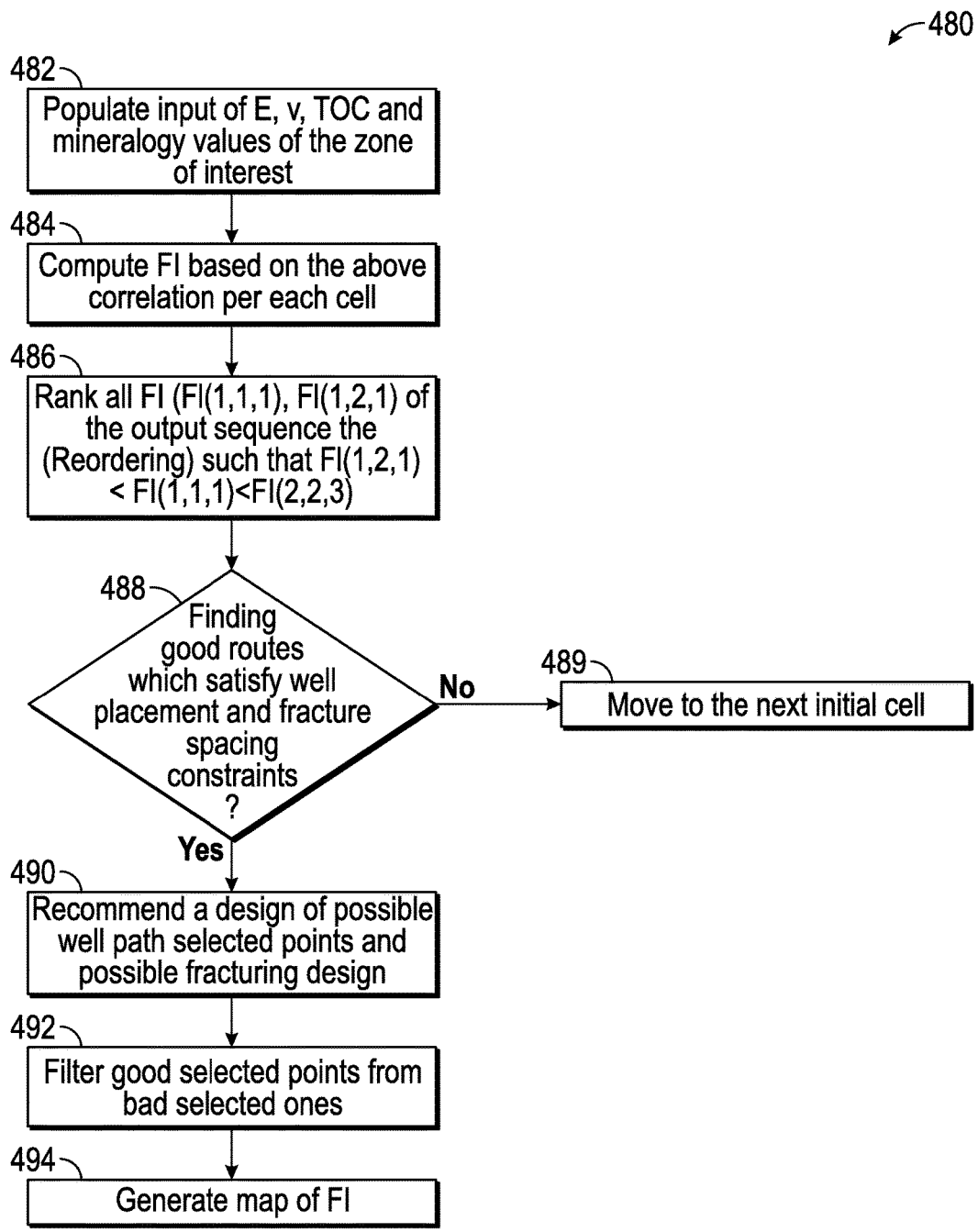
FIG. 12 illustrates a flow chart of operations depicting logical operational steps of an optimization method, in accordance with an example embodiment.

FIG. 12 illustrates a flow chart of operations depicting logical operational steps of an optimization method 480, in accordance with an example embodiment. The flow chart depicted in FIG. 12 illustrates steps or operations of a method 480 for generating an FI map that can be used in the optimization process. Once the process is imitated, an operation can be implemented to divide the well path into segments. Thereafter, an operation can be processed to identify the order of fracture locations along the well path. Such an ordering can include the best fracture from a production point of view, followed by a second fracture stage, and so on. Then, an operation with the same approach for a second well can be repeated, as well as for subsequent wells until the simulation runs determine the prioritized segments.

In conventional fracturing design, introducing a fracture may affect the initiation of subsequent fractures, which can sometimes lead to re-orientation of the fracture and obtaining a non-planar fracture path. This can affect the effective fracture width and production efficiency per stage. Introducing a new design such as described herein can solve this problem.

Thus, the method 480 shown in FIG. 12 includes a step or operation for populating the input of E, v, TOC, and mineralogy values of the zone of interest, as indicated at block 482. Thereafter, as illustrated at block 484, a step or operation can be implemented to compute FI based on the correlation (from block 482) per each cell. Then, as depicted at block 486, a step can be implemented to rank all FI (FI(1,1,1)), FI(1,2,1) of the output sequences (reordering) such that FI(1,2,1)<FI(1,1,1)<FI(2,2,3). Next, as shown at decision block 488, a test can be performed to determine good routes that satisfy well placement and fracture spacing constraints.

Assuming a "No" answer with respect to the operation described at decision block 488, an operation can be implemented as shown at block 489 to move to the next initial cell. Assuming a "Yes" answer with respect to the operation shown at block 488, an operation can be implemented to recommend a design of possible well path selected points and possible fracturing design, as indicated at block 490. Thereafter, as described at block 492, an operation can be implemented to filter good selected points from bad selected points. Finally, as indicated at block 494, a map of the FI can be generated.

Note that in some embodiments, the optimization problem can be solved using integer programming. A commercial solver such as, for example, GUROBI can be of assistance in determining the optimum solutions. To solve some of the examples discussed herein using an integer programming approach, a solver based on a branch-and-cut approach can be employed to handle large-scale optimization problems.

With the large number of horizontal wells drilled in shale formations combined with sometimes more than 100 fracturing stages per well, optimization of well and fracture placement is a necessity. However, much is still not known about the proper method to develop shale reservoirs. There is a general agreement that a high Young modulus and low Poisson ratio values are the key parameters for a promising shale, however there is no general agreement about the exact limits of each. A few authors have made an acceptable definition of the brittleness index.

A key missing component in industry fracturing practice is a method to automate design of fractures and wells in the most productive segments in shale reservoirs. Thus, in another embodiment, as will be discussed shortly, a newly developed optimization technique can be implemented in which wells are placed in the most productive segments of the reservoir. Fractures are placed in an overlapping or staggered design to reduce stress shadowing effect and thus get optimal fracture geometry and improve overall expected reservoir production. The developed optimization technique considers the possibility of staggered fractures, distance between fractures, and well spacing and orientation. This technique allows design of both fracture placement and the sequence of fracturing operations. It is important to state that the optimum distance between fractures is usually not uniform.

Examples are presented comparing the results obtained using the developed technique versus the commonly used approach of drilling wells and creating fractures at a uniform spacing. The comparison clearly shows the advantages of using the proposed optimization technique for designing the placement of wells and fractures, and determining the sequence of fracture creation.

As indicated previously, shale has a ultra-low matrix permeability, consequently requiring the creation of hydraulic fractures in order to maximize the contact area with the reservoir. Productive shale consists of easier and more difficult to fracture portions. Production zones also contain quartz, feldspar, carbonate, and clays, in addition to organic matter (Kerogen). Thus, it is a challenging process to map the best zones to fracture. The key to successful fracture treatments in shale formations is the identification of sweet spots; the parts of the shale reservoir which have higher levels of hydrocarbons and are simultaneously more amenable to induced complex fractures. One approach to this challenge is mapping the geomechanical properties of a reservoir using a previously proposed Fracturability Index (FI) in order to guide optimal well placement and fracture placement and sequencing.

A current technology trend in the industry is to place wells in a uniform manner and to also implement the fractures in an equally spaced distribution along the wells' path. However, this approach does not guarantee system optimality. Multiple simultaneous fractures can create stress shadowing, which may affect the overall reservoir performance by causing some fractures to reorient. Reorientation may lead to suboptimal production of each fracture stage. To help prevent or minimize stress shadowing, the FI index, based on geomechanical and petrophysical principles and properties, was developed to optimize the placement of fractures and to help prioritize and schedule fracture positioning.

The computational approach to FI Optimization is based on mathematical optimization using Integer Programming (IP), which recently proved its superior performance to other optimization techniques in application of vertical well placement. A key advantage behind using IP is the certificate of optimality guaranteed in any optimal solution. This differs from suboptimal approaches, like Evolutionary Metaheuristics, which can give optimal solutions but often become trapped in local optima and provide no guarantee of optimality. The presented integrated approach includes geomechanical, geochemical, petrophysical, rock and fluid properties, and has been shown to be a valuable tool in designing shale reservoirs development plans.

A key next step involves developing a computational approach to design wells and schedule hydraulic fractures to take advantage of the power afforded by the recently developed FI index (for detailed see the flow chart in appendix). For years, industry researchers have accepted zipper fracture, modified zipper fracture, and sequential fracturing approach as a way of placing fractures in unconventional reservoirs. Thus, a novel optimization approach can be implemented to the design of wells and fractures based on the FI map, by guaranteeing minimum well spacing and providing a justified sequencing to fracture implementation.

A goal of well and fracture placement is to maximize the expected total hydrocarbon recovery while respecting cost and operating constraints. A proxy for the expected hydrocarbon recovery from any cell of the reservoir model is the value of the Fracturability Index for that cell. Therefore the objective function can be best represented by maximizing the total sum of FI values from fractured cells based on the well and fracture placement.

Basic types of constraints include the maximum size of each fracture, the maximum total cost of all wells and fractures, the connectivity between each fracture and wellbore, and the spacing between fractures and between fractures and wellbores. Such constraints can limit the geometry, maximum dimensions, and relative placement of each well and fracture. The size of each fracture can be specified in terms of fracture stage width and length, in terms of the amount of proppant and proppant type used in fracture creation, or in terms of simulated reservoir volume (SRV). In an alternative embodiment, the maximum half-length of each fracture was constrained.

In order to obtain a proper formulation, the following parameters can be determined using an optimization technique: the number of fractures, fracture dimensions (e.g., length assuming fracture propagate as a network through the whole fracture stage), fracture locations, optimum scheduling of fracture stages, fracture spacing, and well spacing.

Figure 13:
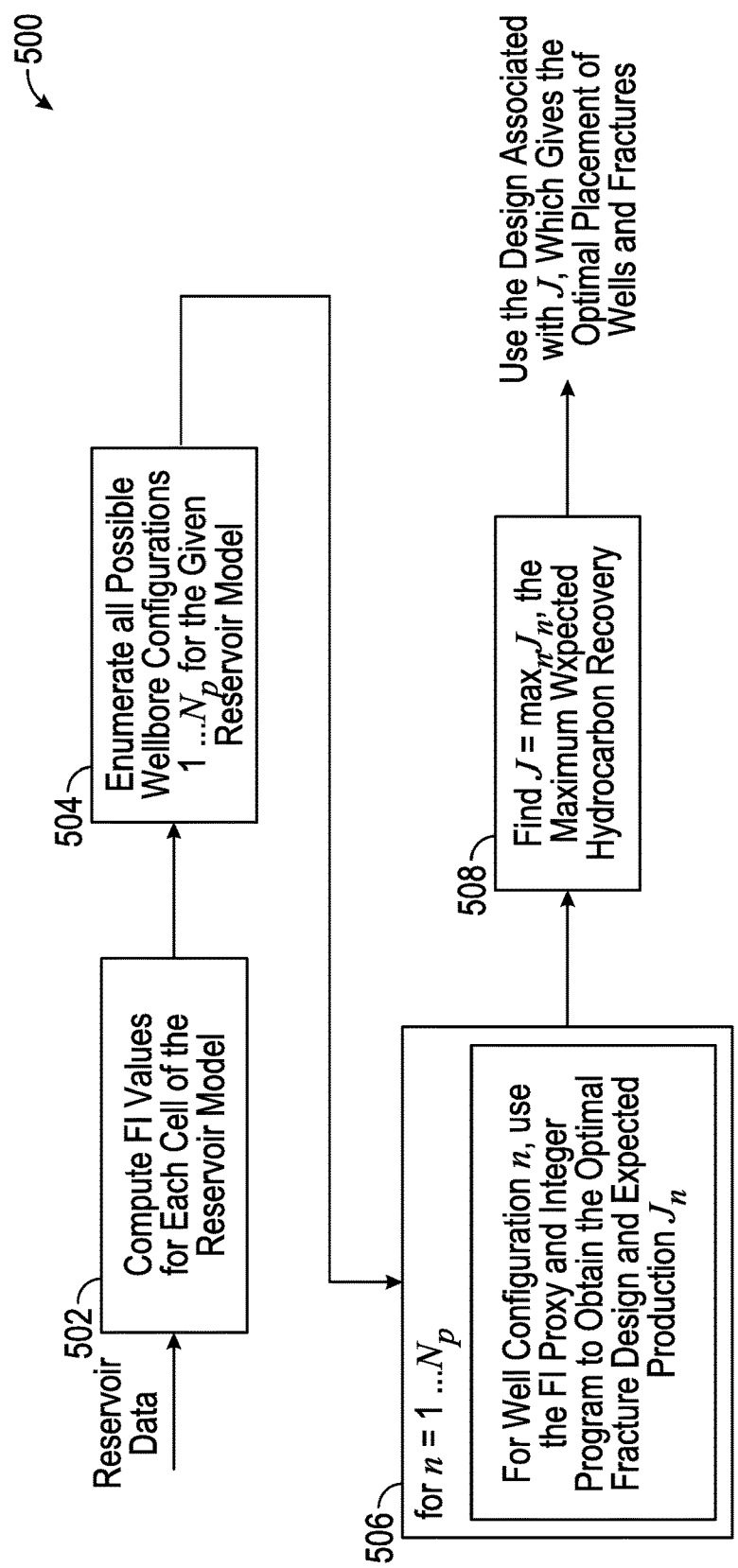
FIG. 13 illustrates a flow chart depicting logical operational steps of an optimization method, in accordance with an example embodiment.

In alternative embodiment, assumptions can be such as, for example, that the symmetric planar bidirectional propagation of the fracture from the wellbore occurs perpendicular to the direction of minimum principal stress. Considerable reduction in the search space for the set of wellbore trajectories can be achieved by requiring that the wellbores are drilled in the direction of minimum horizontal stress. This also allows for an iterative process to be implemented. First, all possible wellbore configurations can be enumerated, which are possible out for a given reservoir model. Then, a solve linear program or method can be solved for each wellbore configuration. The optimal value can be then obtained over the entire search space of wellbore configurations. FIG. 13 describes this process.

FIG. 13 illustrates a flow chart depicting logical operational steps of an optimization method 500, in accordance with another embodiment. As shown at block 502, an operation can be implemented to compute FI values for each cell of the reservoir model using reservoir data (indicated next to the arrow to the left of block 502). Next, as illustrated at block 504, a step or operation can be provided to enumerate all possible wellbore configurations 1 . . . $N_p$ for the given reservoir model. Following processing of the operation depicted at block 504, for n=1 . . . $N_p$ as shown at block 506, for well configuration n, the FI proxy and integer program can be used to obtain the optimal fracture design and an expected production $J_n$. Next, as described at block 508, an operation can be implemented to find $J=\max_n J_n$, the maximum expected hydrocarbon recovery. Finally, as shown to the left of block 508 in FIG. 13, the design associated J can be used, which gives the optimal placement of wells and fractures.

An example problem definition can be seen by reference to decision variables as shown below:

Decision Variables:
$x_j^k \in \{0,1\}$, Indicates if cell j is fractured from wellbore k Sets:
$X^k \subset \{1 \ldots N\}$, Set of indices of the cells able to be fractured from wellbore k
$W^k \subset \{1 \ldots N\}$, Set of cells containing wellbore k
$M^k \subset \{1 \ldots N\}$, Set of cells directly neighboring wellbore k
$E_{11}^j = \{l | l=1 \ldots N, d(j,l) < d_{11}\}$, Set of cells that violating minimum spacing $d_{11}$ with cell j
$E_{12}^j = \{l | l=1 \ldots N, d(j,l) < d_{12}\}$, Set of cells that violate minimum spacing $d_{12}$ with cell j Construction of set $X^k$:
  $j \in X^k$ if (1-3) are all true:
    (1) $j \in 1 \ldots N$
    (2) $d(j,l) \leq L^f$ for some $l \in W^k$ (cell j is sufficiently close to wellbore k)
    (3) $d(j,m) \geq d_{fw} \forall m \in W^p, p=1 \ldots N_w, p \neq k$ (cell j is sufficiently distant from all other wellbores)

Indices:
$j^+(k)$, Index of cell symmetric to cell j across wellbore k
$j^*(k)$, Index of cell connecting cell j to wellbore k along the plane of minimum horizontal stress Parameters:
$FI_j \in [0,1]$, Fracturability Index value for cell j of the reservoir
$C_j^k \in [0,1]$, Cost of fracturing cell j from wellbore k
N, Total number of cells in reservoir model
B, Maximum allowable cost of all fracturing $N_w$, Number of wellbores (total wells & laterals)
$d_{12}$, Minimum spacing between fractures emanating from different wellbores
$d_{11}$, Minimum spacing between fractures emanating the same wellbore
$d_{fw}$, Minimum spacing between fractures emanating from one wellbore and all other wellbores
$L_f$, Maximum fracture half-length In an alternative example optimization embodiment, it can be assumed that the wells are horizontal or very close to horizontal. An objective function can be provided as shown in the equation below, which indicates that the goal of the developed scheme is to maximize the sum of the fracturability indices at the points where fractures propagate.

$$\max \sum_k \sum_{j \in X^k} FI_j x_j^k$$

Constraints include the spacing of fractured node j and other fractures from the same wellbore.

The maximization of the function in the equation above is subject to constraints in the following equations:

$$x_j^k + x_i^k \leq 1, \forall i \in (M^k \cap E_{1j}^j), j \in M^k, k \in 1, \ldots, N_w$$

The equation below states that a minimum spacing of fractures emanating from different wellbores is specified:

$$x_j^k + x_i^l \leq 1, \forall j \in X^k, \forall i \in (X^l \cap E_{1j}^j), \forall k, l = 1, \ldots, N_w, k \neq l$$

The spacing of fractures emanating from different wellbores is constrained as shown in the equation below:

$$x_j^k + x_i^l \leq 1, \quad \forall i \in (X^l \cap E_{1j}^j), j \in X^k, k \in 1, \quad \ldots \quad, N_w, \\ l=1, \ldots, N_w, l \neq k$$

The equation below demonstrates connectivity of the fracture to the wellbore:

$$x_j^k - x_j^k \leq 0, \forall j \in X^k, \forall k=1 \ldots N_w$$

The equation below indicates the symmetry of the fracture around the wellbore:

$$x_j^k - x_j^k \leq 0, \forall j \in X^k, \forall k=1 \ldots N_w$$

Finally, the equation below shows the total cost of fracturing:

$$\Sigma_{k=1}^{N_w} \Sigma_{j \in X^k} C_j^k x_j^k \leq B$$

Note that maximum length constraints include the fracture length, Xf<distance to drainage boundary, Xe. To maximize the equation(s) using an IP methodology, a commercial solver based on branch-and-cut optimization can be utilized as discussed earlier. The GUROBI software package can be utilized as a solver to solve practical instances of the problem, and MATLAB can be used in generating instances of the problem.

Next, the stress interference or shadow effect can be simply explained as follows.

First, the situation regarding a same wellbore can be considered. Once the first fracture is created, pressure inside the fracture is still high causing an excess in the resultant stresses second fracture in the same well will suffer, sometimes second fracture may change propagation orientation. Allowing enough spacing and time for implementing two consecutive fractures would be helpful in avoiding this phenomenon. This has been referred to in some instances intra-well shadowing. This problem can be tackled by allowing minimum spacing and time span between implemented fractures.

Second, consider the situation of two adjacent parallel wells. That is, alternating fractures between two parallel horizontal wells would be helpful in reducing the effect of stress shadowing. This will also help in allowing time span of implementing sequential fractures.

Regarding well placement, for the current model it can be assumed that we have two horizontal wells in the shale model, wherein the two wells are parallel and the minimum distance between a fracture extending from one well and another wellbore is a variable input. The maximum length of half fracture cannot exceed well spacing.

Thus, a new approach of optimizing wells and fracture stages locations can be implemented, which combines the application of Fracturability Index mapping with the use of mathematical optimization, while providing for simultaneous determination of the optimal design for well and fracture placement. This new technique can employ an integer programming approach with a linear objective function and equality and inequality constraints, and can also produce overlapping or zipper fracture type designs. Example implementations of this method has been demonstrated for the design of the placement of multiple wells and fractures in a reservoir based on field data for a shale reservoir in Permian Basin. Example case studies have shown that the optimization technique can produce designs with either equally or not equally spaced fractures depending on the particular set of reservoir data and constraints considered.

The new integer programming approach can also be used with other sweet spot identification techniques. The method's current form relies on the use of the Fracturability Index for Shale quality mapping, providing a link between the objective function to be optimized and the relative ease of creating fracture stages based upon the local reservoir geomechanical properties. Coupling efficient proxy and interactive process of well placement reduce the numerous need for many reservoir simulations runs and engineering experience.

In another embodiment, the extensive usage of a computational fracture simulator to develop a grid-based fracture stimulated reservoir volume (SRV) can be implemented. The objective of such an approach is to choose the initial points for creating fractures. The interactions between pre-existing natural fractures and induced fractures are modeled to develop higher stimulated volume within the shale reservoir. The effect on SRV values of ranges of numerous geomechanical and geochemical parameters [Young modulus (2 E6-10 E6 psi), poission ratio (0.10-0.40), mineralogy of rock types (quartz 10 wt. %: 80 wt. %) in the reservoir] have been investigated.

Additionally, a linear programming-based approach can be used to mathematically optimize reservoir development. This approach can improve the placement of fractures in quantifiably better zones in shale reservoirs utilizing a mathematical optimization approach to guarantee optimality of the reservoir development plan given the available data and modeling constraints. This approach is useful in, for example, pad drilling and development applications applied to shale formations.

The number of optimum wells, number of optimum fractures within the wells, and the spacing between wells and fractures will be suggested using the approach. It is believed that fracturing the optimum zones will contribute to higher hydrocarbon production from shale and tight formations.

This technology will be able to globally optimize the placement of surface pads, optimize the location and design of wells attached to the pads, and will also optimize the location of the fractures throughout the wells. This design will also take into account numerous practical design constraints, including length of wells, number of wells associated with a pad, numerous overlap constraints inherent in unconventional gas and oil well development, etc. The development will be optimized based on maximizing the FI values explored by the final network and will be constrained by the previously mentioned considerations as well as a global maximum number of wells and a maximum development budget. In addition, the mathematical framework allows for easy extensibility to other constraints and can be customized based on user needs.

This particular approach (which will be discussed in more detail shortly) can be applied to current unconventional wells and hydraulic fracture designs in unconventional shale plays. This technology allows developers to create longer fractures in subterranean formations using models that honor geomechanical constraints. The longer fractures enhance the productivity of the hydraulically fractured well by hitting natural fractures and reaching complexity in shale resources. This technology will aid in optimally designing newly created and newly expanded non-conventional reservoirs.

Determining good fracture points and good recovery points is a challenge for many production companies. The problem of efficiently placed fractures is handled here. Recently, engineers at a major service company analyzed production logs from almost 100 horizontal shale gas wells in six US shale basins and discovered that only 70% of perforations contribute to production.

The cost for developing a well and its associated fractures is estimated at $4,000,000. Due to this, having only a portion of these fractures producing hydrocarbon leads to longer lead times for production profits to pay off the initial investment cost. Additionally, naïve placement of wells can lead to unnecessary expenditure due to placing a greater number of wells where fewer would not only suffice, but would be superior. Due to lower hydrocarbon prices predicted in the future, as well as the continued demand for hydrocarbons throughout the world, especially in North America, being able to efficiently develop and produce from unconventional resources is key to economic development.

Efficient and optimized development of shale reservoirs can further lead to energy independence for North America, a key goal of the United States government considering recent and historical geopolitical instability revolving around gas and oil resources.

The creation of well-planned designs controlled by fracture placement in a 3D domain is the goal of such an embodiment (to be discussed in greater detail shortly). Simulated reservoir volume, which is the key to optimum production in shale plays, can be modeled using a novel approach based on digitized grids, where each discrete cell in the grid takes into account geomechanical and geochemical properties of the reservoir in focus to accurately model a simulated reservoir volume resulting from placed fractures. As of this writing, there is no reliable, industrially used approach to simulate reservoir volume modeling.

In addition, the approach heavily utilizes mathematical optimization methods uncommon in this field, which can guarantee provably optimal solutions instead of relying on suboptimal approaches to address the key problem of well and fracture placement.

The following describes the numerical formulation of the newly developed technology.

Figure 14:
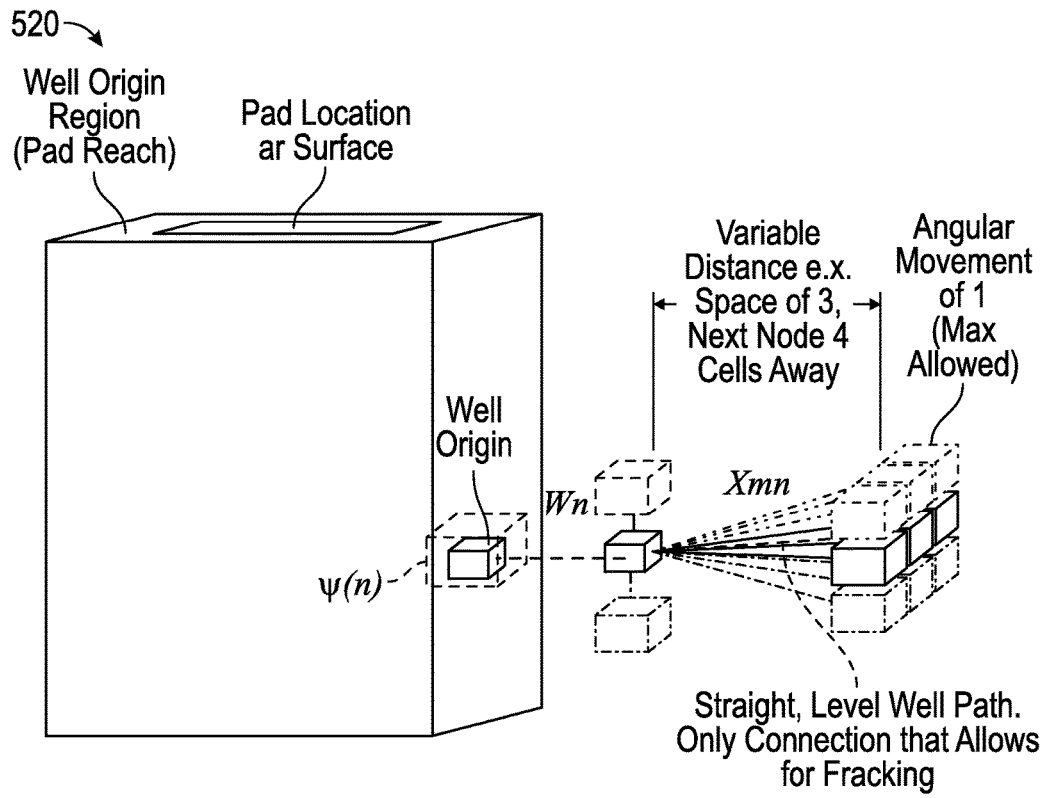
FIG. 14 illustrates a geometric interpretation of the basic network connection in a well, in accordance with an example embodiment.
Figure 15:
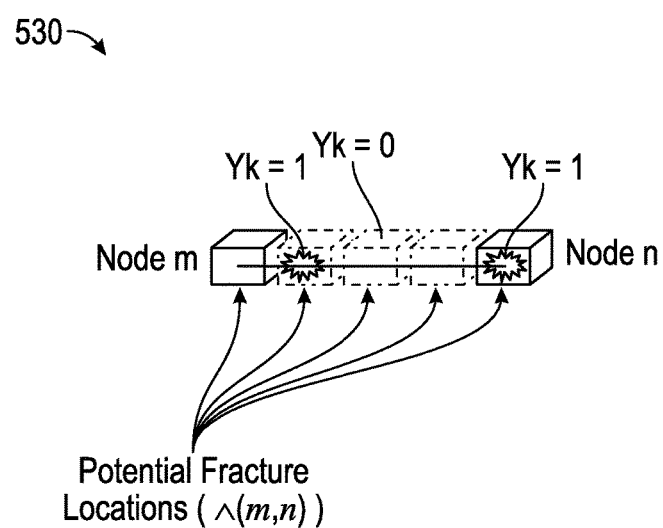
FIG. 15 illustrates a hydraulic fracture nodes representation, in accordance with an example embodiment.
Figure 16:
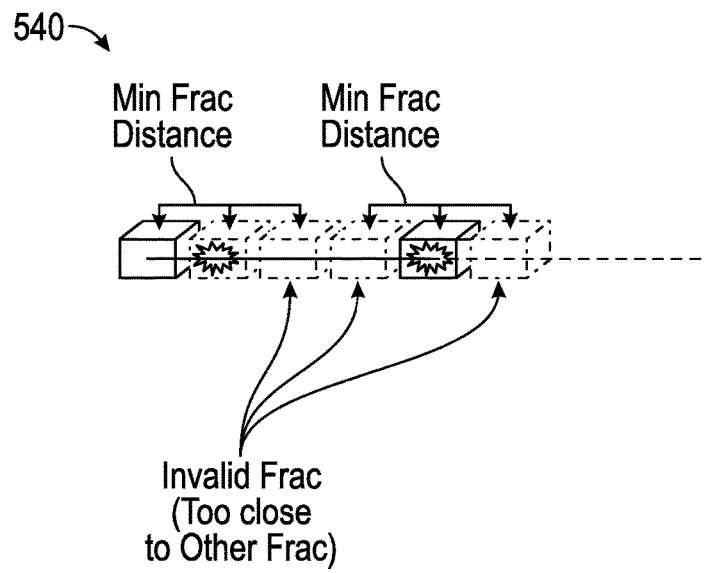
FIG. 16 illustrates valid nodes for a fracture, in accordance with an example embodiment.
Figure 17:
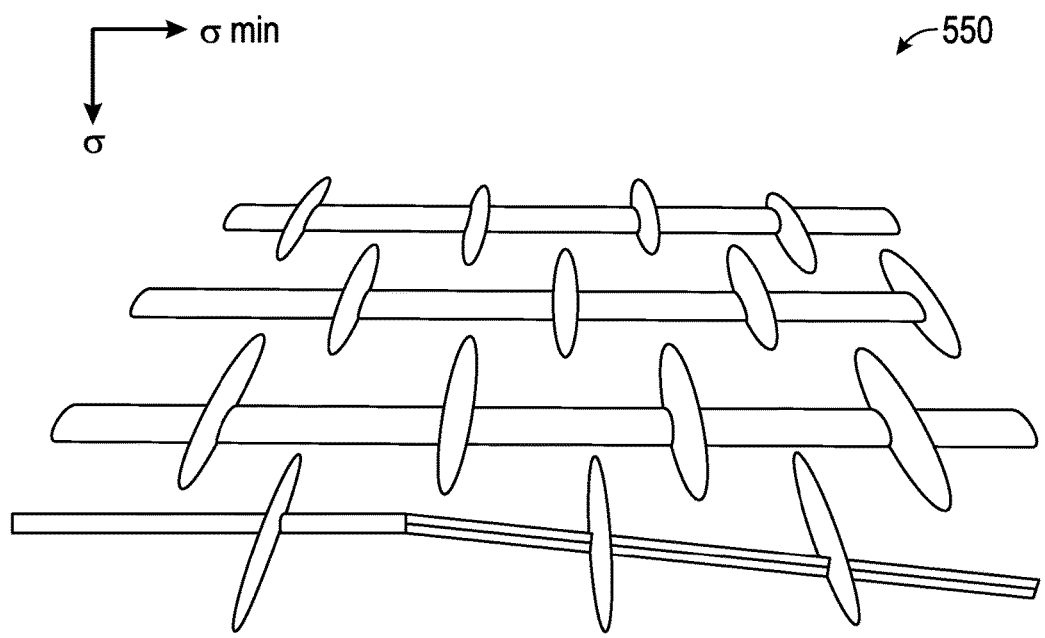
FIG. 17 illustrates a schematic diagram depicting a combination of wells and fractures for a model, in accordance with an example embodiment.

Sets
1. $A_{mn}$, the total FI values unlocked by the stage from node m to node n
2. $F_k$, the total FI values unlocked by fracturing at node k
3. $L_{mn}$: length of stage from node m to node n
4. $E_I(n)$, the edges inbound to node n
5. $E_O(n)$, the edges outbound from node n
6. $S(n)$, the set of stages that connect to or pass through node n, represented as edges in the network
7. $\psi(n)$, the set of starting nodes mutually exclusive with w
8. E, the set of valid edges for the network
9. $\Lambda(m, n)$, the set of fractures accessible from the stage between node m and node n
10. $\Phi(n)$, the set of nodes whose fracture effect would intersect the fracture effect of node n
11. $\Omega(n)$, the set of stages intersected or interfered with by fracturing node n Decision Variables
1. $W_n$: well origin for single well originating at node n, continuous
2. $X_{mn}$: flow of connections from node m to n, continuous
3. $Y_n$: fracturing of node n, continuous
4. $S_{nm}$: usage of stage connecting node m to n, binary Constants
1. MinSpace: minimum spacing between fractures
2. MinStageSpace: minimum spacing between stages
3. MaxStageSpace: maximum spacing between stages
4. MaxLength: maximum allowed length for a single well
5. MaxStages: maximum number of active stages in a well
6. MaxFPS: maximum number of fractures per stage
7. MaxWells: maximum number of wells per pad
8. MaxPads: maximum number of pads per reservoir
9. MaxPadCost: maximum cost for global development
10. MaxCost: maximum cost for global development
11. Thickness: reservoir thickness
12. WC: cost for initial construction of a well originating from a pad
13. $PC_{mn}$: cost for construction of a well segment from node m to n
14. FC: cost for creating a fracture Objective
max $\Sigma A_{mn} X_{mn} + \Sigma F_k Y_k$ Constraints
1. $S_{nm} \in \{0, 1\}$ [active stage variable, may not be used. This will depend on practical results; I'm expecting integrality of other variables due to the objective function]
2. $0 \leq W_{\alpha,n} < 1$
3. $0 \leq X_{mn} \leq 1$
4. $0 \leq Y_k \leq 1$
5. $\Sigma_{p|(n,p) \in EO(n)} X_{np} - \Sigma_{m|(m,n) \in EI(n)} X_{mn} \leq 0$ [flow conservation with no sink]
6. $\Sigma X_{m',n} \leq 1$, (m', n')$\in S(n)$ [non-overlap constraint]
7. $\Sigma X_{w,n} \leq 1$, n'$\in \psi(n)$ [non-overlap constraint]
8. $\Sigma_{(i,j) \in E}(X_{ij} * L_{ij}) \leq$ MaxLength [constrains length of well]
9. $\Sigma_k Y_k \leq$ MaxStages [constrains number of stages in well]
10. $\Sigma_k W_{\alpha,k} \leq$ MaxWells [constrains number of wells per pad]
11. $-X_{mn} *$ MaxFPS $+ \Sigma_{k \in \Lambda(m,n)} Y_k \leq 0$ [access to fractures for active stages; limited to straight, level stages]
12. $\Sigma_{k \in \Phi(n)} Y_k \leq 1$ [non-overlap of fracture effect]
13. $\Sigma_{k|dist(n,k)<MinSpace} Y_k \leq 1$ [minimum spacing between two fractures, focused on node n]
14. $|\Omega(n)| * Y_n + \Sigma_{(i,j) \in \Omega(n)} X_{ij} \leq |\Omega(n)|$ [non-overlap of fracture effect for node k with stages that the SRV would intersect or be too close to (within 50 ft)]
15. $WC \Sigma_k W_{\alpha,k} + \Sigma_{(i,j) \in E}(X_{ij} * PC_{ij}) + FC \Sigma_k Y_k \leq$ MaxCost FIG. 14 illustrates a geometric interpretation of a basic network 520 connection in a well, in accordance with an example embodiment. FIG. 15 illustrates a hydraulic fracture nodes representation 530, in accordance with an example embodiment. FIG. 16 illustrates valid nodes for a fracture, in accordance with an example embodiment. FIG. 17 illustrates a schematic diagram 550 depicting a combination of wells and fractures for a model, in accordance with an example embodiment.

The optimization procedure can be implemented by first, obtaining a detailed 3D map of geomechanical properties of unconventional shale reservoir using industry standard sonic techniques. Second, an FI algorithm and correlation-built SRV can be utilized to provide for a 3D distribution of the reservoir quality shale model. Third, a field level optimization procedure can be implemented to obtain the optimum number of wells and fractures, as well as the placement of the wells and fractures.

Figure 18:
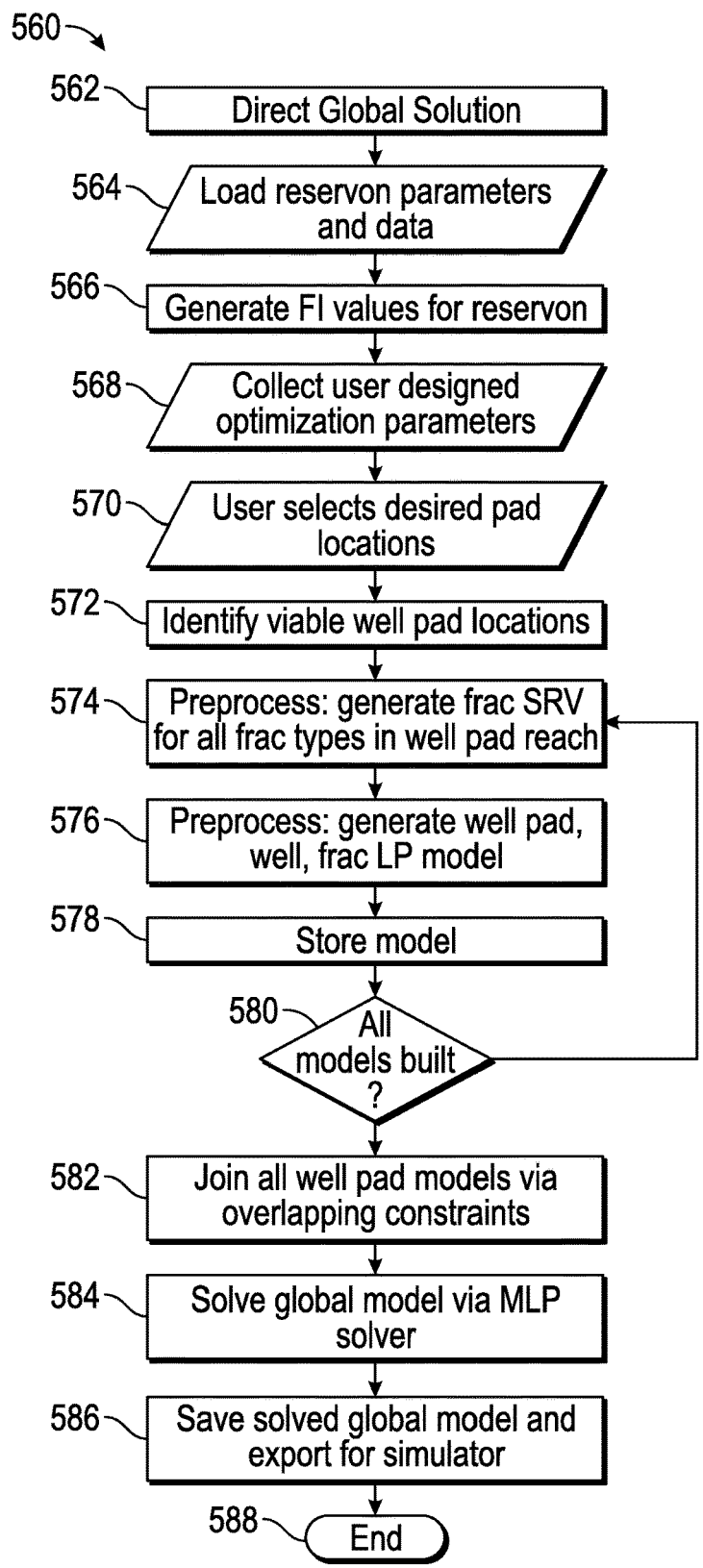
FIG. 18 illustrates a flow chart of operations depicting a method for optimization, in accordance with an example embodiment.

FIG. 18 illustrates a flow chart of operations depicting a method 560 for optimization, in accordance with an example embodiment. As indicated at block 562, a step or operation can be processed to implement a direct global solution as discussed earlier. Next, as shown at block 564, reservoir parameters and data can be loaded. Then, as depicted at block 566, the FI values for the reservoir can be generated. Thereafter, as illustrated at block 568, user-designed optimization parameters can be collected. Next, as shown at block 570, a user can select desired pad locations. Following processing of the operation depicted at block 570, viable well pad locations can be identified, as indicated at block 572.

Then, as shown at block 574, a preprocess operation can be implemented in which a frac SRV is generated for all frac types within reach of the well pad. Another preprocess operation can be implemented, as shown at block 576, in which the well pad, the well, and frac LP model are generated. The resulting model can then be stored in a database or memory (e.g., memory 202), as shown at block 578. Thereafter, as indicated at decision block 580, a test can be performed to determine if all models have been built. If not, then the operations shown at blocks 574, 576, and 578 can be repeated. If so, then the process continues as depicted next at block 582.

Following processing of the decision operation depicted at block 580, an operation can be implemented, as shown at block 582 in which all well pad models are joined via overlapping constraints. Then, as described at block 584, an operation can be implemented to solve the global model via an MLP solver. The global model is then saved and exported for a simulator as indicated at block 586. The process of method 560 can then terminate, as shown at block 588.

Figure 19:
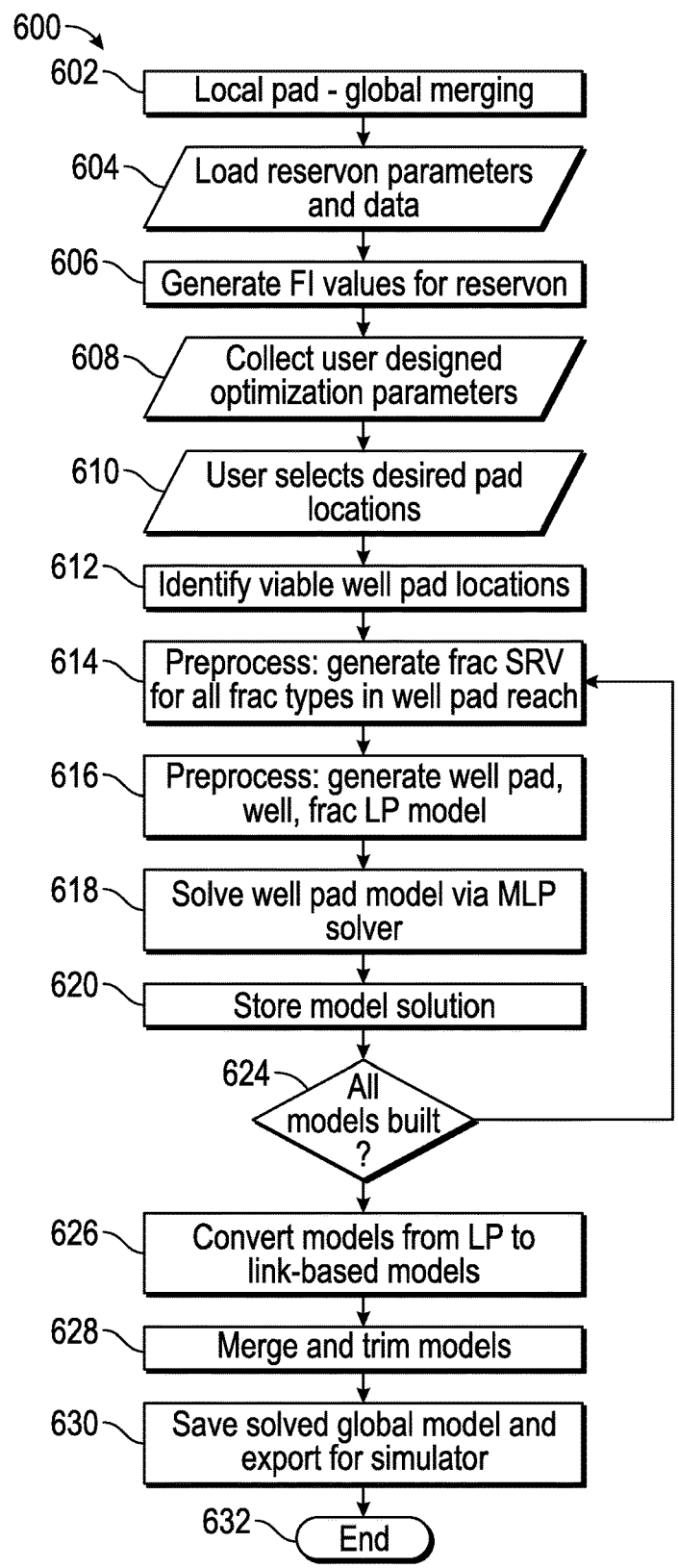
FIG. 19 illustrates a flow chart of operations depicting another method for optimization, in accordance with an example embodiment.

FIG. 19 illustrates another optimization method 600, in accordance with an example embodiment. As shown at block 602, an operation can be implemented in which the "local pad≥global merging." As indicated next at block 604, reservoir parameters and data can be loaded. Then, as illustrated at block 606, FI values for the reservoir can be generated. Following processing of the operation depicted at block 606, an operation can be implemented in which user-designed optimization parameters are collected, as shown at block 608. The user can then select desired pad locations, as indicated at block 610. Viable well pad locations can be then identified, as shown at block 612.

Following processing of the operation illustrated at block 612, a preprocessing operation can be implemented as indicated at block 614 to generate a frac SRV for all frac types in reach of the well pad. Then, as indicated at block 616, another preprocessing operation can be implemented to generate the well pad, the well, and the frac LP model. Thereafter, as depicted at block 618, the well pad model can be solved via an MLP solver. The model solution can then be stored, as described a block 620. A test can then be implemented to determine if all models have been solved, as depicted at decision block 624. If so, then an operation can be implemented to convert models from LP to link-based models, as illustrated at block 626. The models can then be merged and trimmed, as described at block 628. The global model can be saved and exported for simulator, as depicted at block 630. The process of method 600 can then terminate, as indicated at block 632.

Based on the foregoing, it can be appreciate that a number of embodiments are disclosed. For example, in one embodiment, a method of generating a fracturability index for use in identifying fracture locations and propagation in subterranean formations can be implemented. Such an example embodiment may include steps or logical operations for dividing a path into a plurality of segments; identifying an order of fracture locations along the path, the order based on an optimal fracture stage from a production point of view followed by subsequent fracture stages; and repeating the dividing and identifying steps with respect to additional paths so as to generate data for use in determining prioritized segments and identifying fracture locations and propagation in a subterranean formation. The path constitutes a well path.

In some example embodiments, a step or operation can be implemented for compiling the data into a fracturability index map. In some example embodiments, the aforementioned subterranean formation may be a shale gas reservoir. In another example embodiment, a step or operation can be provided for compiling the data as geochemical data populated in a 3D reservoir model. In yet another example embodiment, a step or operation can be implemented for compiling the data into a geomechanical data map based on geomechanics. In another example embodiment, a step or logical operation can be provided for identifying the path via a sensor.

In another example embodiment, a system of generating a fracturability index for use in identifying fracture locations and propagation in subterranean formations can be implemented. Such a system can include, for example, one or more processors; a memory comprising instructions stored therein, which when executed by the one or more processors, cause the one or more processors to perform operations comprising: dividing a path into a plurality of segments; identifying an order of fracture locations along the path, the order based on an optimal fracture stage from a production point of view followed by subsequent fracture stages; and repeating the dividing and identifying steps with respect to additional paths so as to generate data for use in determining prioritized segments and identifying fracture locations and propagation in a subterranean formation.

In yet another example embodiment, a method for 3D well placement and interdigitated fracture design for shale gas reservoirs can be implemented. Such a method can include steps or logical operations for placing fractures in an overlapping or staggered design while selectively locating fractures to remain within a producing zone; and introducing a lower number and thus more effective fracture at a pre-designated distance a previous fracture wherein a minimum or optimum stress exists so that a net pressure overcomes a stress anisotropy ratio to create a longer and not tortuous fracture.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method of fracturing a reservoir by generating a fracturability index for use in identifying fracture locations and propagation in a subterranean formation in said reservoir for said fracturing of said reservoir, said method comprising:

dividing a path into a plurality of segments;
identifying an order of fracture locations along the path including said plurality of segments, said order of fracture locations based on a fracture stage of a fracturing operation followed by subsequent fracture stages in said fracturing operation;
repeating said dividing and identifying steps with respect to additional paths so as to generate said fracturability index comprising data for use in determining prioritized segments among said plurality of segments and identifying said fracture locations and propagation in said subterranean formation and wherein said fracturability index is used to identify at least one sweet spot in said subterranean formation, said fracturability index including ellipsoids of fracture domains, staggered features, minimum fracture spacing, minimum well spacing and overlapping features; and
fracturing said reservoir based on said data contained in said fracturability index, said prioritized segments, said fracture locations and said propagation in said subterranean formation with respect to said reservoir, wherein said fracturing operation includes said fracturing and said fracturing is performed based on a formulation that includes the following parameters: a number of fractures contained in said data in said fracturability index, fracture dimensions contained in said in said fracturability index, said fracture locations, and fracture scheduling associated with said fracturing operation.

2. The method of claim 1 wherein said path comprises a well path and wherein said fracturability index is used to prioritize brittle and high in-situ stress zones along said well path.

3. The method of claim 2 further comprising compiling said data into a fracturability index map based on said fracturability index wherein said fracturability index is further used to suggest an order of potential fracture locations for future resource development in a single well or a plurality of wells $$FI = \Sigma_k (1 \text{ if the segement brittle}^{0 \text{ if the segement not brittle}}).$$

4. The method of claim 1 wherein said subterranean formation comprises a shale gas reservoir.

5. The method of claim 1 further comprising compiling said data as geochemical data populated in a 3D reservoir model and as TOC (Total Organic Carbon) data in a TOC map.

6. The method of claim 5 further comprising compiling said data into a geomechanical data map based on geomechanics, said geomechanical data including geochemical data indicative of quartz and clays and wherein said 3D reservoir model provides data indicative of brittle locations in said 3D reservoir model.

7. The method of claim 2 further comprising compiling said data as TOC (Total Organic Carbon) data populated in a TOC map, permeability data populated in a permeability map, and porosity data populated in a porosity map.

8. The method of claim 2 further comprising compiling said data into a geomechanical data map based on geomechanics.

9. The method of claim 1 further comprising identifying said path via a sensor.

10. A system for fracturing a reservoir by generating a fracturability index for use in identifying fracture locations and propagation in a subterranean formation in said reservoir, said system comprising:

one or more processors; and
memory comprising instructions stored therein, which when executed by said one or more processors, cause said one or more processors to perform one or more operations comprising:
dividing a path into a plurality of segments;
identifying an order of fracture locations along said path including said plurality of segments, said order of fracture locations based on a fracture stage of a fracturing operation followed by subsequent fracture stages of said fracturing operation;
repeating said dividing and identifying steps with respect to additional paths so as to generate said fracturability index comprising data for use in determining prioritized segments and identifying said fracture locations and propagation in said subterranean formation and wherein said fracturability index facilitates determining at least one sweet spot in said subterranean formation, said fracturability index including ellipsoids of fracture domains, staggered features, minimum fracture spacing, minimum well spacing and overlapping features; and
wherein said system is utilized to facilitate fracturing of said reservoir based on said data contained in said fracturability index, said prioritized segments, said fracture locations and said propagation in said subterranean formation with respect to said reservoir, wherein said fracturing is performed based on a formulation that includes the following parameters: a number of fractures contained in said data in fracturability index, fracture dimensions contained in said data in fracturability index, said fracture locations, and fracture scheduling associated with said fracturing.

11. The system of claim 10 wherein said path comprises a well path and wherein said fracturability index is used to prioritize brittle and high in-situ stress zones along said well path.

12. The system of claim 11 wherein said one or more operations further comprises compiling said data into a fracturability index map based on said fracturability index wherein said fracturability index is further used to suggest an order of potential fracture locations for future resource development in a single well or a plurality of wells $$FI = \Sigma_k (1 \text{ if the segement brittle}^{0 \text{ if the segement not brittle}}).$$

13. The system of claim 10 wherein said subterranean formation comprises a shale gas reservoir.

14. The system of claim 10 wherein said one or more operations further comprises compiling said data as geochemical data populated in a 3D reservoir model and said data as TOC (Total Organic Carbon) data populated in a TOC map, permeability data populated in a permeability map, and porosity data populated in a porosity map.

15. The system of claim 14 wherein said one or more operations further comprises compiling said data into a geomechanical data map based on geomechanics, said geomechanical data including geochemical data indicative of quartz and clays and wherein said 3D reservoir model provides data indicative of brittle locations in said 3D reservoir model.

16. The system of claim 10 further comprising a sensor for identifying said path, wherein said sensor communicates electronically with said one or more processors and/or said memory.

17. The system of claim 11 wherein said one or more operations further comprises compiling said data as TOC (Total Organic Carbon) data populated in a TOC map, permeability data populated in a permeability map, porosity data populated in a porosity map, and maturation data populated in maturation map, wherein said compiled data facilitates a determination of said at least one sweet spot.

18. The system of claim 11 wherein said one or more operations further comprises compiling said data into a geomechanical data map based on geomechanics.

19. The system of claim 11 further comprising a sensor for identifying said path, wherein said sensor communicates electronically with said one or more processors and/or said memory.

\* \* \* \* \*

UNITED STATES PATENT AND TRADEMARK OFFICE
CERTIFICATE OF CORRECTION

PATENT NO.           : 10,480,289 B2
APPLICATION NO.      : 14/865447
DATED                : November 19, 2019
INVENTOR(S)          : Alzahabi et al.

Page 1 of 1

It is certified that error appears in the above-identified patent and that said Letters Patent is hereby corrected as shown below:

On the Title Page

At Item (72), Inventors: At Line 5 after (US) add Ghazi Dhafer AlQahtani, Dhahran, SA Signed and Sealed this
Twenty-seventh Day of October, 2020

Andrei Iancu
*Director of the United States Patent and Trademark Office*